United States Patent [19]

Tazunoki et al.

[11] Patent Number: 5,309,011
[45] Date of Patent: May 3, 1994

[54] WAFER SCALE OR FULL WAFER MEMORY SYSTEM, PACKAGING METHOD THEREOF, AND WAFER PROCESSING METHOD EMPLOYED THEREIN

[75] Inventors: Masanori Tazunoki, Tokyo; Hiromitsu Mishimagi, Akishima; Makoto Homma, Tokyo; Toshiyuki Sakuta, Hamura; Hisashi Nakamura, Ohme; Keiji Sasaki, Musashino; Minoru Enomoto, Tokorozawa; Toshihiko Satoh, Sayama; Kunizo Sahara, Tokyo; Shigeo Kuroda, Ohme; Kanji Otsuka, Higashiyamato; Masao Kawamura, Fuchu; Hinoko Kurosawa, Hino; Kazuya Ito, Kodaira, all of Japan

[73] Assignee: Hitachi, Ltd., Tokyo, Japan

[21] Appl. No.: 960,848

[22] Filed: Oct. 14, 1992

Related U.S. Application Data

[60] Division of Ser. No. 627,881, Dec. 13, 1990, Pat. No. 5,191,224, which is a continuation of Ser. No. 184,871, Apr. 22, 1988, abandoned.

[30] Foreign Application Priority Data

| Apr. 22, 1987 | [JP] | Japan | 62-97326 |
| Apr. 22, 1987 | [JP] | Japan | 62-97329 |
| Apr. 22, 1987 | [JP] | Japan | 62-97330 |
| Apr. 22, 1987 | [JP] | Japan | 62-97331 |
| Apr. 24, 1987 | [JP] | Japan | 62-99779 |

[51] Int. Cl.⁵ ............ H01L 27/02; H01L 27/10; H01L 27/15
[52] U.S. Cl. ............ 257/390; 257/401; 257/391
[58] Field of Search ............ 365/200, 201; 371/10; 257/401, 390, 391, 296, 204, 206, 208, 368

[56] References Cited

U.S. PATENT DOCUMENTS

| 4,365,319 | 12/1982 | Takemae | 365/200 |
| 4,380,066 | 4/1983 | Spencer et al. | 371/10 |
| 5,072,424 | 12/1991 | Brent et al. | 365/189.01 |

FOREIGN PATENT DOCUMENTS

| 52-76842 | 6/1977 | Japan | 371/10.2 |
| 56-18439 | 2/1981 | Japan | H01L 21 |
| 62-72156 | 4/1987 | Japan | H01L 27/04 |

OTHER PUBLICATIONS

"A 4-Mbit Full-Wafer ROM" Kitano et al., IEEE Journal of Solid-State Circuits, vol. SC-15 No. 4 Aug. 19 pp. 686-693.

Hewlett-Packard Journal, vol. 34, No. 8, Aug. 1983, PALO ALTO US-pp. 14-20 (LOB et al)-"High Performance VLSI Memory System", p. 14, right column line 10-p. 15 left column, line 15.

Primary Examiner—Jerome Jackson
Assistant Examiner—D. Monin
Attorney, Agent, or Firm—Antonelli, Terry, Stout & Kraus

[57] ABSTRACT

To achieve higher packaging density and one wafer level for a full-sized wafer memory, or wafer-scale integration memory system, the wafers are vertically stacked with each other at a predetermined interval. A packaging technique is improved in such a way that a memory system layout can be precisely realized and a precise through hole can be formed. Moreover, other chips are fixed on the wafer so as to achieve furthermore the high packaging density.

25 Claims, 14 Drawing Sheets

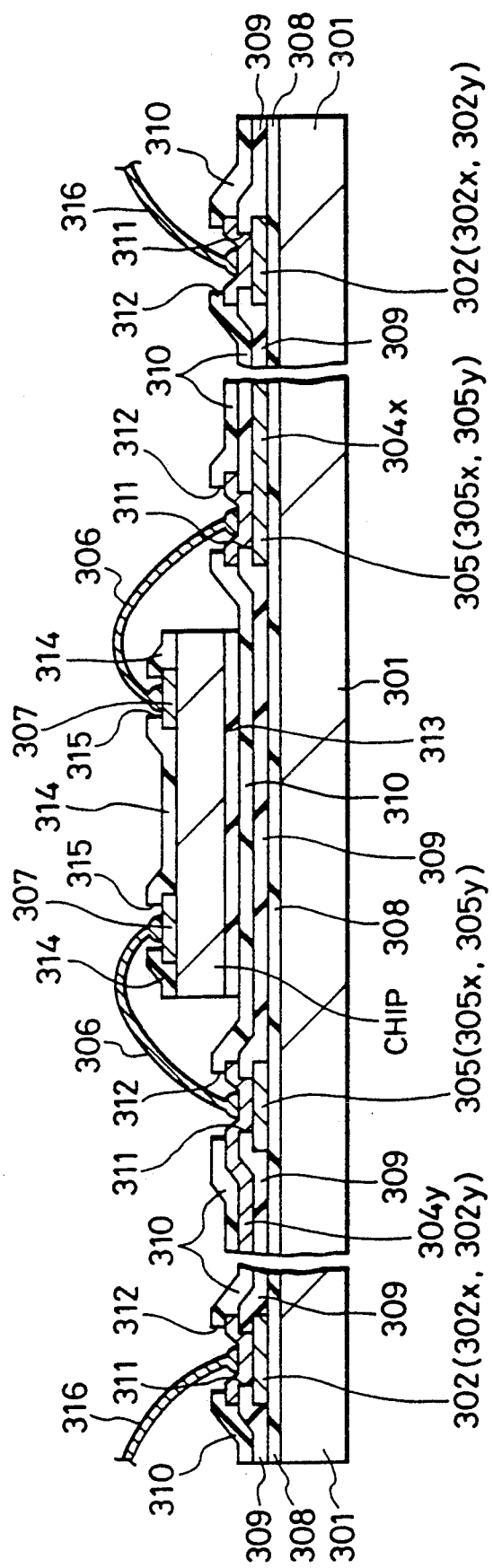

WAFER SCALE OR FULL WAFER MEMORY SYSTEM, PACKAGING METHOD THEREOF, AND WAFER PROCESSING METHOD EMPLOYED THEREIN

This is a divisional application of application Ser. No. 07/627,881, filed Dec. 13, 1990, now U.S. Pat. No. 5,191,224 which is a continuation application of application Ser. No. Ser. No. 07/184,871, filed Apr. 22, 1988 now abandoned.

BACKGROUND OF THE INVENTION

The present invention generally relates to a packaging technique for a semiconductor integrated circuit, and more particularly to a packaging technique for a semiconductor integrated circuit employing a large-sized semiconductor substrate such as a semiconductor wafer.

In general, a semiconductor integrated circuit is constructed on a region, i.e., a semiconductor wafer chip, which is subdivided at the dicing regions after forming the semiconductor wafer. However, different researches have been recently made on the construction of a semiconductor integrated circuit where the semiconductor wafer is not subdivided, but a plurality of integrated circuits are fabricated on the entire semiconductor wafer so as to construct a large-sized semiconductor integrated circuit. Such a semiconductor manufacturing technique is described in, e.g., Japanese patent KOKAI (Disclosure) 61-290739, in which one large-sized semiconductor integrated circuit is constructed on the entire semiconductor wafer.

The present invention further relates to a semiconductor device, and more particularly to a useful technique applicable to a semiconductor device wherein a plurality of semiconductor chips are mounted on mounting substrates (module), and thereafter these mounting substrates are sealed by the same package.

To achieve higher package density of a semiconductor chip, a plurality of semiconductor chips are provided in a single package. Each of the semiconductor chips provided within the package is mounted on a mother chip. Aluminum wiring lines overlay the mother chip to interconnect the semiconductor chips. The aluminum wiring lines and the semiconductor chips are connected by bump electrodes made of gold (Au), solder and so on. For instance, the conventional semiconductor device where a plurality of semiconductor chips are mounted on a single package is described in Japanese patent KOKAI (Disclosure) application No. 60-198758.

The present invention further relates to a wafer-sized semiconductor integrated circuit device, and, for instance, to a useful technique for providing a wafer-sized semiconductor memory device.

A semiconductor memory device fabricated using a wafer-sized very large scale integrated circuit (VLSI) has been proposed in, for instance, Japanese patent KOKAI (Disclosure) application No. 59-201441. In the wafer-sized semiconductor memory device as described in the above application, cutting the failing chips and relieving these defective chips are performed in such a way that fuses, or power source lines, are cut out by irradiating focused ion beams, or laser light rays, and only the fault-free chips are connected by the final wiring.

Moreover, the present invention further relates to a method for manufacturing a packaging substrate, and, more particularly, to a useful technique applicable to a packaging substrate for packaging an LSI (large scale integrated circuit) chip.

A chip carrier type package, as a package suitable for higher packaging density of LSI, is known (known from, for instance, "VLSI Device Handbook", issued on Nov. 28, 1983, pages 226 to 228 by Science Forum). The so-called "alumina green sheet (non-sintered alumina sheet)" is most commonly utilized as the material of the packaging substrate employed for packaging the LSI in accordance with the above chip carrier method (for example, described on pages 239 to 242). When forming the packaging substrate by employing this green sheet, through holes are formed by way of photolithography and etching techniques which are commonly utilized for fabricating an LSI; thereafter, for instance, W-paste is printed to fill the through holes with the W-paste; and, finally, the green sheet is sintered.

SUMMARY OF THE INVENTION

As a first aspect of the present invention, the present applicants have found the following problems after carefully considering the semiconductor integrated circuit which has been fabricated using a large semiconductor substrate such as an entire semiconductor wafer, as discussed previously.

That is to say, since there is no packaging technique applicable for the semiconductor integrated circuit employing the above-described entire semiconductor wafer, it is impossible to package the semiconductor integrated circuit on a packaging substrate.

An object of the present invention is to provide a technique for packaging, on a packaging substrate, a semiconductor integrated circuit device employing a large-sized semiconductor substrate such as a semiconductor wafer (e.g., an entire semiconductor wafer), and the packaged semiconductor device, using such large-sized semiconductor substrate, so produced.

The above-described object, other objects of the invention and novel features thereof will be readily apparent from the description in the present specification and the accompanying drawings.

One aspect of the present invention disclosed hereinafter will now be summarized as follows. That is to say, a packaging device for packaging a semiconductor integrated circuit fabricated on a large-sized semiconductor substrate, such as a semiconductor wafer, is arranged so as to be supported at a central portion (e.g., at the center) of said semiconductor substrate.

Since, according to the above-described means, a large-sized semiconductor substrate, in which is fabricated a semiconductor integrated circuit, is stably supported, there can be provided a packaging device for packaging said semiconductor substrate under a stable condition. Thus, a packaged device, including a large-sized semiconductor substrate (preferably, a plurality of large-sized semiconductor substrates) and the packaging device mounting the large-sized substrates at the centers thereof, can be provided.

As further structure embodying this aspect of the present invention, the foregoing objects are achieved by a packaging device, according to the invention, constructed of a plurality of pillars standing on a peripheral portion of a large-sized semiconductor substrate, such as a semiconductor wafer having fabricated therein an integrated circuit; a semiconductor substrate supporting member mounted on each of said pillars; and a pillar connecting substrate for connecting the respective pillars.

Since, according to this embodiment of the present invention, the semiconductor substrate can be supported at a plurality of portions thereof, a stable packaging can be realized without any vibration and twist on the semiconductor substrate.

As a further aspect of the present invention, the present applicants have found the following problems after carefully investigating conventional semiconductor devices where the semiconductor chips are connected by bump electrodes to a mother chip.

In such conventional semiconductor devices, an underlying film made of tungsten and titanium is formed between aluminum wiring leads, on the one hand, and gold or solder for constituting the above-described bump electrodes, on the other. This is because gold or solder is easily removed from the silicon oxide film which covers the aluminum film. However, adhesion between gold or solder, and tungsten or titanium functioning as an underlayer, is relatively weaker than that between the bonding wires made of an aluminum film or gold, on the one hand, and the bonding pads made of an aluminum film, on the other, so that the former gold or solder tends to be removed from the underlayer. As a consequence, the semiconductor chips are readily removed from the mother chip.

Moreover, since the bump electrode is present between the semiconductor chip and the mother chip, a gap is established between the semiconductor chip and the mother chip, which causes the efficiency of heat radiation (heat removal from the semiconductor chip) to be lowered. This problem is specifically conspicuous in that the temperature in the semiconductor package is considerably increased if a plurality of semiconductor chips are provided within the same package.

It is therefore an object of this aspect of the present invention to improve the reliability of connection between the semiconductor chip and the mounting substrate.

Another object of the present invention is to increase the heat radiation (heat removal) effect of the semiconductor device where a plurality of semiconductor chips are provided on a nounting substrate.

The above-described object, other objects of the present invention, and novel features thereof will be readily apparent from the descriptions of the present specification and the accompanying drawings.

This further aspect of the present invention will now be summarized as follows:

That is to say, a major feature of the invention is characterized in that a bonding wire is interconnected between the semiconductor chip and the wiring lines formed on the substrate on which the above-described semiconductor chip is mounted. Moreover, the rear surfaces of the semiconductor chip is attached (e.g., directly mounted) on the mounting substrate, without bump electrodes.

Since, according to the above-described means of the invention, the connection between the bonding pad provided on the semiconductor chip and the bonding wire thereof, and also the connection between the bonding wire and the bonding pad provided on the mounting substrate are made rigid, the reliability of the interconnection between the semiconductor chip and the substrate on which this semiconductor chip is mounted can be improved.

Since, moreover, the rear surface of the semiconductor chip is attached to the mounting substrate, the radiation effect on the heat produced in the semiconductor chip can be improved.

As a further aspect of the present invention, in the above-described conventional technique of cutting failing chips and relieving defective chips, a large number of manufacturing steps, and a large number of masks, are required. As a result, the throughput is not improved and a high cost of manufacturing is involved. Moreover, a redundant block for relieving defects is built in the memory system body within the wafer, so that to increase the redundancy, the total area on which the entire system body is occupied must be reduced. To discover the fault block by means of a probe, lower throughput must be accepted. Moreover, such a probe check can cause a defect.

It is, therefore, an object of this further aspect of the present invention to provide a wafer-sized semiconductor integrated circuit device where a reasonable defect-relieving method can be realized.

The above-described object, other objects of this aspect of the present invention and novel features thereof will be readily apparent from the description in the present specification and the accompanying drawings.

This aspect of the present invention, disclosed hereinafter, will now be summarized as follows. That is to say, the semiconductor integrated circuit device is characterized by comprising a plurality of circuit blocks having specific circuit functions, whereby block addresses are allocated so as to designate the respective circuit blocks.

Since, according to this aspect of the present invention, specific circuit blocks are designated with (e.g., located at) specific block addresses, the probe test for an individual circuit block can be separately performed at the above-described block address. As a consequence, the cutting of the defective block can be essentially achieved by employing the probe test at the above-described block address.

As a further aspect of the present invention, the present applicants became aware of the following difficulties/ while taking account of the conventional technique of using an aluminum green sheet as the material of the packaging substrate, with through holes formed by photo-lithography. That is to say, since the interval between successive through holes is different before and after sintering of the green sheets, respectively, due to the shrinkage of the green sheet which is sintered, it is almost impossible to form a through hole at a high positioning precision. As a result, there is a drawback in the alignment process of the photo-lithography step for forming, on the above-described green sheet, the connecting wire made of the W paste filled in this through holed and the wire to be connected thereto.

An object of the present invention is to provide a technique for manufacturing a packaging substrate where a fine through hole, formed at the higher positioning precision, is filled with a metal for constructing the connection wire.

The above-described object, other objects of this aspect of the present invention, and novel features thereof will easily be apparent from the description in the present specification and the accompanying drawings.

This aspect of the present invention, disclosed hereinafter, will now be summarized as follows. The semiconductor manufacturing method according to this aspect of the present invention is characterized by comprising the steps of:

forming a through hole by irradiating a beam (e.g., electron beam, laser beam or ion beam) on the semiconductor substrate;

forming an insulating film on the surface of the semiconductor substrate by thermal-oxidizing the semiconductor substrate; and filling metal into the through hole.

This aspect of the present invention also involves the product made by this manufacturing method. For example, by this method a mounting substrate, of, e.g., a semiconductor material, can be provided.

Since, according to the above-described means of the invention, a through hole is formed (e.g., through a semiconductor substrate) by the beam irradiation, the fine through hole can be formed with higher positioning precision, and also the connection wire can be formed by filling the metal into this through hole.

BRIEF DESCRIPTION OF THE DRAWINGS

The invention will now be described further by way of illustration only and with reference to the accompanying drawings, in which:

FIG. 3C is a sectional view of the semiconductor chip, taken along a line passing therethrough, mounted on a mounting substrate;

DETAILED DESCRIPTION OF THE INVENTION

Embodiment 1

Figure 1A:
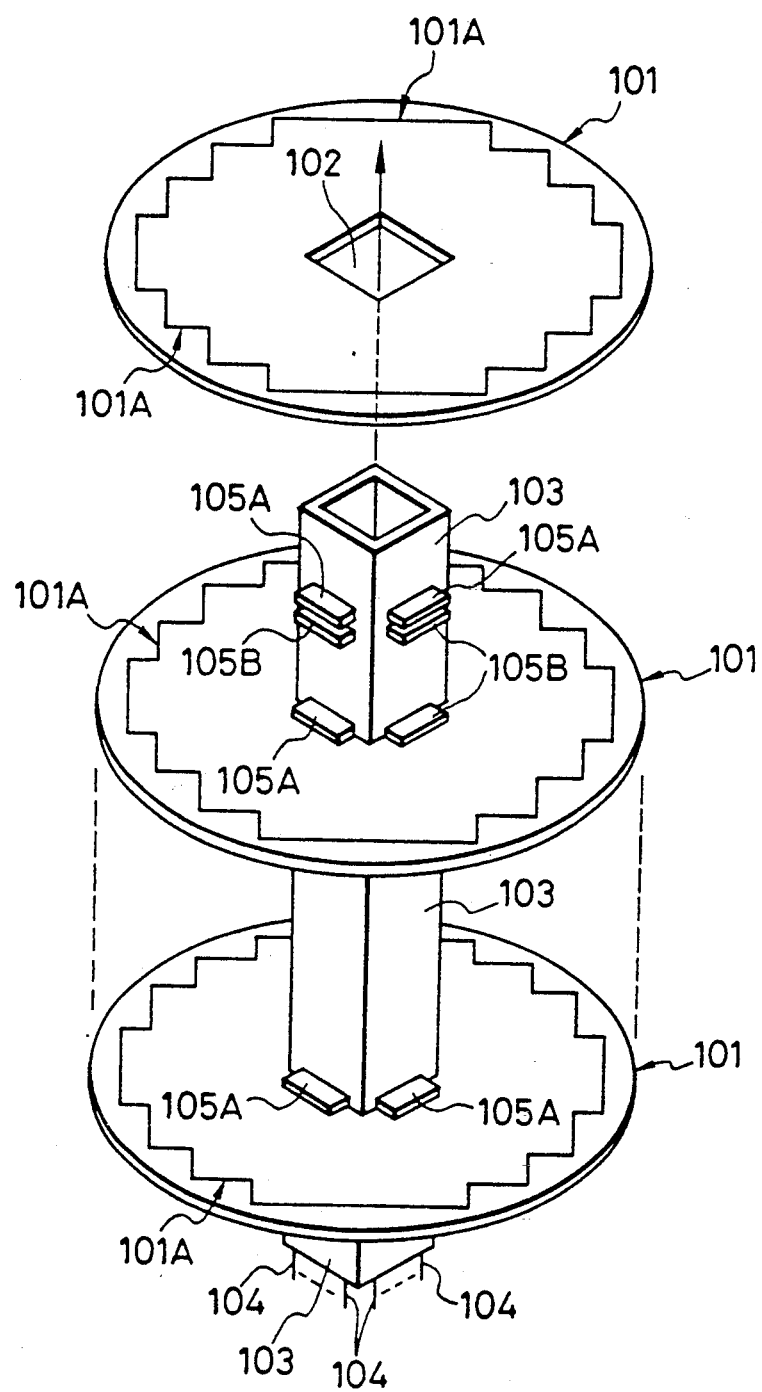
FIG. 1A is a perspective view of an entire packaging device for supporting a plurality of large-sized semiconductor substrates each constituted by a semiconductor wafer.

In a semiconductor integrated circuit device according to the present invention, as illustrated in FIG. 1A, an integrated circuit region 101A, on which various integrated circuits have been constructed, is present on a surface of a large-sized semiconductor substrate 101 of a semiconductor wafer. At a central portion of the above-described semiconductor substrate 101, a rectangular opening 102 which has been formed by, for instance, etching treatment (e.g., chemical etching), is formed. The semiconductor substrate 101 is supported by an upper supporting member 105A and a lower supporting member 105B made of, e.g., an epoxy resin in such a manner that a rectangular pillar 103 made of, for instance, an aluminum alloy or a plastic resin is pierced through the opening 102, and the substrate is sandwiched by both the upper and lower supporting members 105A and 105B formed on the four sides of the pillar 103. The central portion of this pillar 103 is made hollow. A size of the opening 102 of the substrate 101 is defined under the condition that the pillar 103 can be substantially penetrated through the opening 102 while both the upper and lower supporting members 105A and 105B are bent toward the pillar side. It should be noted that if the pillar 103 is made of a metal such as aluminum, the surface of the metal pillar is covered with a resin so as to electrically insulate wiring leads. A plurality of connector pins 104 are formed on the bottom of the pillar 103 so as to package the pillar 103, which has a plurality of semiconductor substrates 101 mounted thereon, on a packaging substrate (not shown).

Figure 1B:
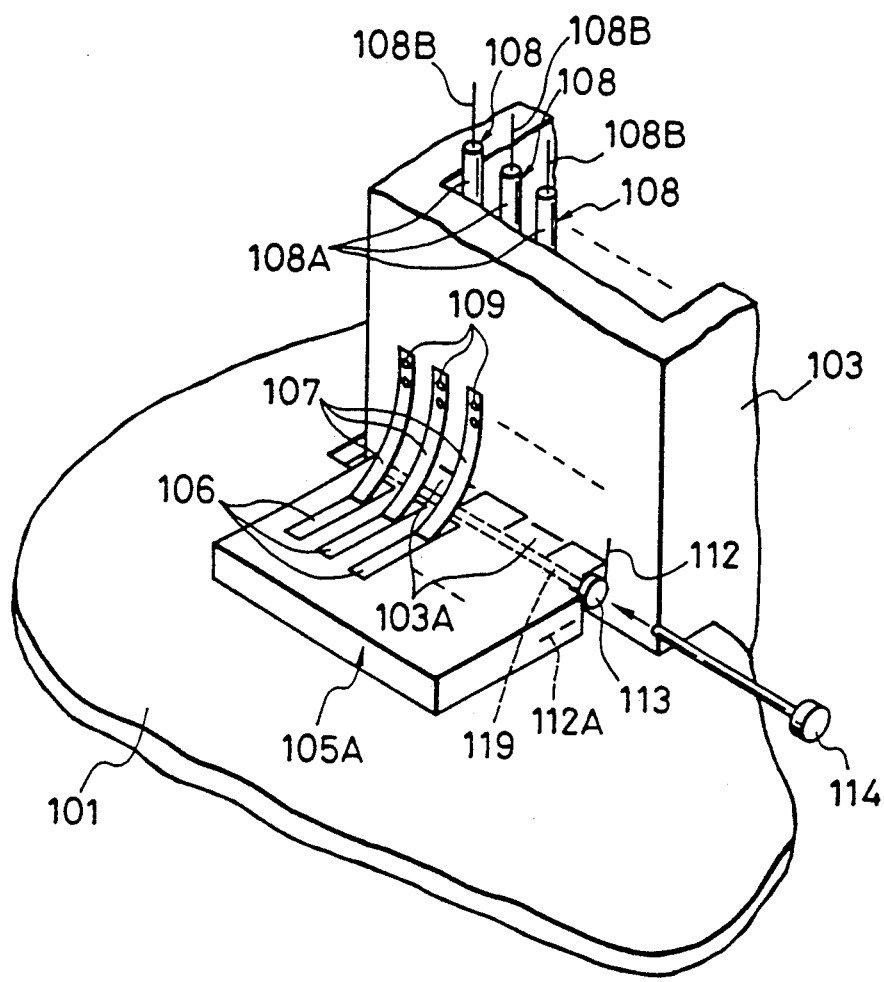
FIG. 1B is an enlarged perspective view of a supporting member employed in the packaging device shown in FIG. 1A.
Figure 1C:
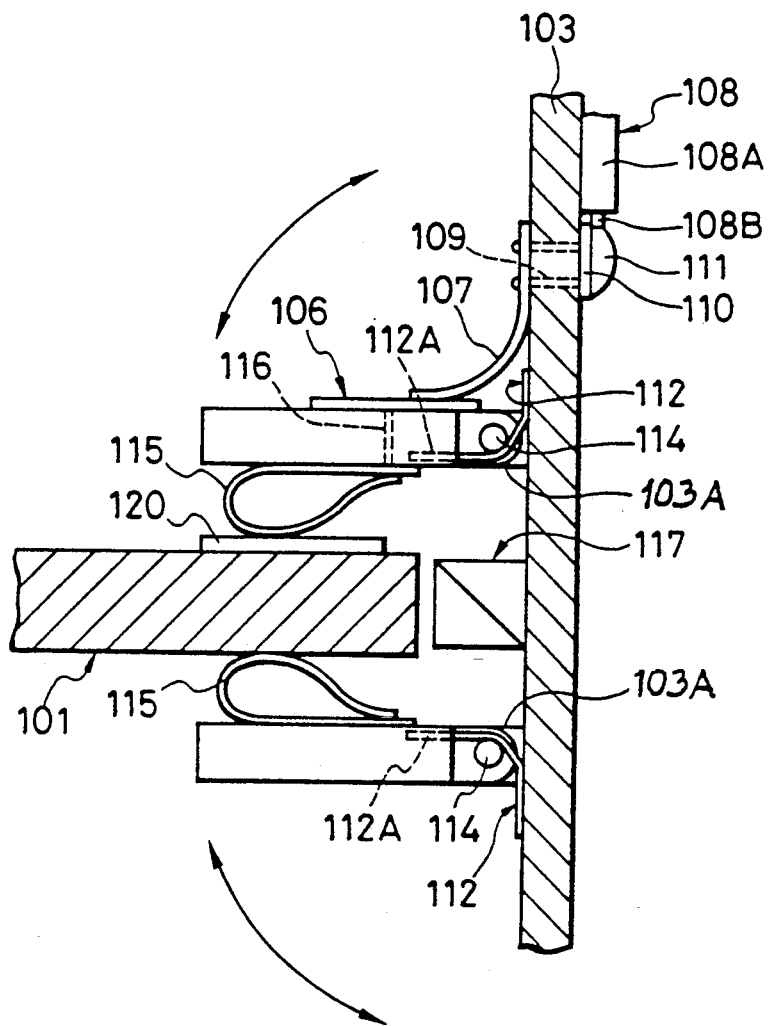
FIG. 1C is a side view of the supporting member.

Both the upper and lower supporting members 105A and 105B have such a shape that, as illustrated in FIGS. 1B and 1C, each edge thereof located at the pillar 103 is engaged with a supporting projection 103A which projects from the pillar 103. A hole 119 having a supporting shaft 114 penetrating therethrough is formed on the upper supporting member 105A, lower supporting member 105B, and supporting projection 103A, respectively. That is to say, both the upper and lower supporting members 105A and 105B are mounted on the supporting projection 103A in such a manner that they can be rotated with respect to the supporting axis 114 as its rotating center. To sandwich the semiconductor substrate 101 by the upper and lower supporting members 105A and 105B, a twist coil springs 112 is arranged on both the upper and lower supporting members 105A and 105B, one end 112A of each twist coil spring 112 is fixed to either the upper supporting member 105A or lower supporting member 105B, and the supporting shaft 114 is penetrated through a central hole 113 thereof. It is seen that only twist coil spring 112 of one edge of the respective upper and lower supporting members 105A and 105B is shown in FIGS. 1B and 1C. As a result, the semiconductor substrate 101 is supported by the upper and lower supporting members 105A and 105B by means of the elasticity of the above-described twist coil spring 112.

A plurality of fixing electrodes 106 are fixed on the upper surface of the upper supporting member 105A, which fixing electrodes are made of aluminum on which, for instance, copper or silver is plated. A plurality of brush electrodes 107 having elasticity are provided on the side of the pillar 103 corresponding to the fixing electrodes 106, and one end of the respective brush electrodes is resiliently in contact with a surface of the corresponding fixing electrodes 106. The end portion of the respective brush electrodes 107 which is resiliently in contact with the respective fixing electrodes is slidable on the corresponding fixing electrode 106 when the upper supporting members 105A are rotated. Another electrode 110 made of, for example, copper, is provided on an inner surface of the pillar 103, in relation to the above-described brush electrode 107, and is connected to the brush electrode 107 by a lead 109 made of, for instance, aluminum on which silver is plated. Between this lead 109 and the pillar 103, an epoxy resin is provided for electrical insulation. A core 108B of an electrically insulated cable 108, the surface of which is covered with an insulating film 108A such as a resin (e.g., vinyl chloride), is connected to the corresponding electrode 110 by, for example, solder 111. The insulated cable 108 is attached to the pillar 103 by an adhesive agent so that these insulated cables are employed to connect between the respective semiconductor substrates 101 provided on the pillar 103 and also the semiconductor substrate 101 and the connector pin 104 shown in FIG. 1A.

A spring electrode 115 having elasticity is provided adjacent the upper surface of the semiconductor substrate, at a location corresponding to the respective fixing electrodes 106 of the upper supporting member 105A. A pin 116 made of, for example, silver-plated aluminum is mechanically and electrically connected between the spring electrode and the fixing electrode 106. The respective spring electrodes 115 are resiliently in contact with an electrode 120 made of, for example, an aluminum film which is provided on the surface of the semiconductor substrate 101. Also, a spring electrode 115 is provided on the lower supporting member 105B in order that it is used as a supporting member for sandwiching the semiconductor substrate 101. That is to say, the semiconductor substrate 101 is supported in such a manner that a plurality of spring electrodes 115 respectively provided on the upper and lower supporting members 105A and 105B sandwich this substrate 101.

When the semiconductor substrate 101 is loaded on the pillar 103, as illustrated in FIG. 1C, the upper and lower supporting members 105A and 105B are bent toward the pillar by manual operation. To prevent the semiconductor substrate 101, which is supported by both the upper and lower supporting members 105A and 105B, from being vibrated in the horizontal direction, a rubber 117 made of, for instance, a silicone rubber for preventing the horizontal vibrations is employed between the upper supporting member 105A of the pillar 103 and the lower supporting member 105B.

It should be noted that the pillar 103 may be shaped as a cylinder according to the invention. In this case, it is apparent that the shape of the opening 102 formed through the semiconductor substrate 101 may be circular.

It should also be noted, as further structure, that both rear surfaces of two sheets of semiconductor substrates 101, on which rear surfaces no intergrated circuit 101A is arranged, can be connected to each other by an adhesive agent, and thus the connected semiconductor substrates are sandwiched by these upper and lower supporting members 105A and 105B. In this case, an interval between the upper and lower supporting members 105A and 105B is wider than that of a single semiconductor substrate 105.

The following effects according to the present preferred embodiment will be achieved.

(1) The packaging device according to the present preferred embodiment is so constructed that the center portion of the above-described semiconductor substrate 101 is supported by the pillar 103 which passes through the center portion of the large-sized semiconductor substrate 101, and also by the upper and lower supporting members 105A and 105B mounted on the pillar 103. Accordingly, since the large-sized semiconductor substrate 101 can be supported in a stable condition, a packaging device for stably packaging the semiconductor substrate 101 can be obtained.

(2) Since the spring electrodes 115 are provided on the upper and lower supporting members 105A and 105B for sandwiching the semiconductor substrate 101, the semiconductor substrate 101 can be stably supported, and, simultaneously, electrical connection can be established between the respective semiconductor substrates 101, and also between the semiconductor substrate 101 and the packaging substrate on which the packaged device is mounted. The packaging substrate can be a conventional printed circuit board, on which the pillar is mounted at its one end, in a manner such that the pillar extends perpendicular to the main surface of the circuit board.

(3) As the connector pin 104 is mounted on the bottom of the pillar 103, the pillar 103 can be packaged onto the packaging substrate (via the mounting pins), and, simultaneously, electrical connection can be achieved.

(4) Since the center portion of the semiconductor substrate 101 is connected to the pillar 103, the maximum distance between this connection point and any arbitrary point on the circuit region 101A is substantially equal to a half of the diameter of the semiconductor wafer 101 so that a difference between transferring speeds can be reduced.

(5) As the center portion of the semiconductor substrate 101 is supported, and no shielding part is present around the semiconductor substrate, the heat radiation effect can be improved.

(6) Since a plurality of semiconductor substrates 101 are mounted on the pillar 103 in such a way that these substrates are successively overlapped along the pillar 103, a large quantity of circuits can be arranged within a smaller packaging area.

While the present invention has been described using a specific embodiment, it should be understood that further modifications and changes can be made without departing from the scope of the present invention.

Figure 1D:
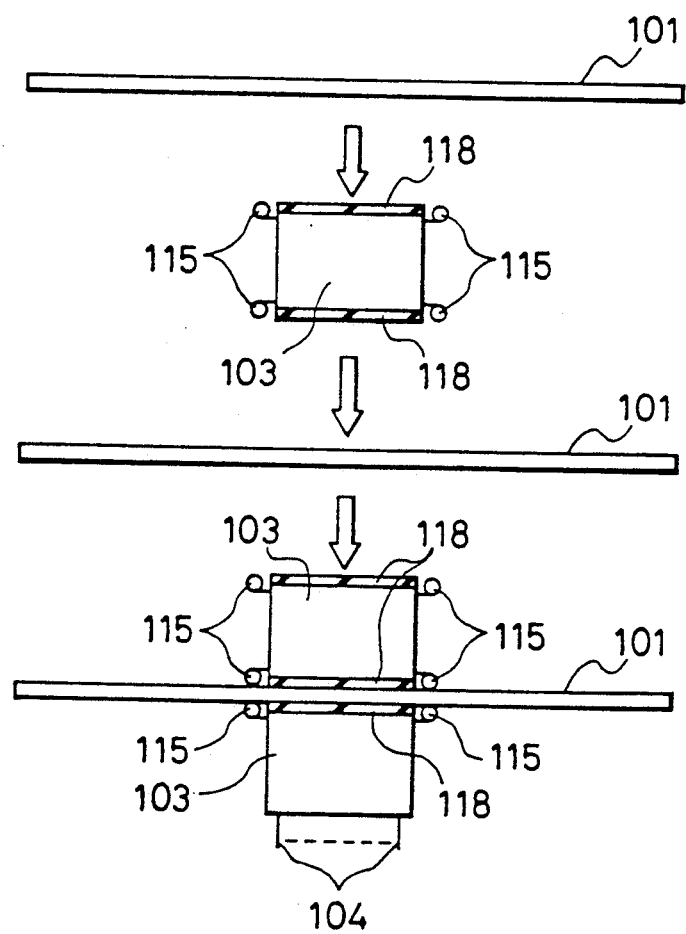
FIG. 1D is a side view of a modified supporting member.

For instance, the packaging device according to the invention may be constructed as a packaging device as shown in FIG. 1D.

In FIG. 1D, the semiconductor substrate 101 has no opening 102 as illustrated in FIGS. 1A to 1C. The shape of the pillar 103 is formed as a rectangular pillar or a cylindrical pillar, the upper and lower edges of which are flat surfaces. That is to say, an interior of the pillar 103 is formed as a cavity, and both the upper and lower ends thereof are made closed. An adhesive agent 118 (for example, an epoxy adhesive) is coated on both the closed upper and lower ends of the pillar 103. The adhesive agent 118 is coated on both the upper and lower ends, which are in turn attached to the central portion of the semiconductor substrate 101. No integrated circuit is constructed on the portion of the semiconductor substrate 101 to which the pillar 103 is attached. Connecting electrodes (not shown) are employed on both surfaces of the semiconductor substrate 101, corresponding to the electrode 115 mounted on the pillar 103. Electrical connection is made between the electrodes formed on both surfaces of the semiconductor substrate 101 via a connecting hole which penetrates through the semiconductor substrate 101.

The pillar 103 and semiconductor substrate 101 are alternately stacked from the bottom.

The advantage achieved by the above-described preferred embodiment will now be summarized. That is to say, since the central portion of the semiconductor substrate is supported in providing the packaging device, and thus, a large-sized semiconductor substrate can be stably supported, a packaging device for packaging the large-sized semiconductor substrate in a stable condition can be realized.

Embodiment 2

Figure 2A:
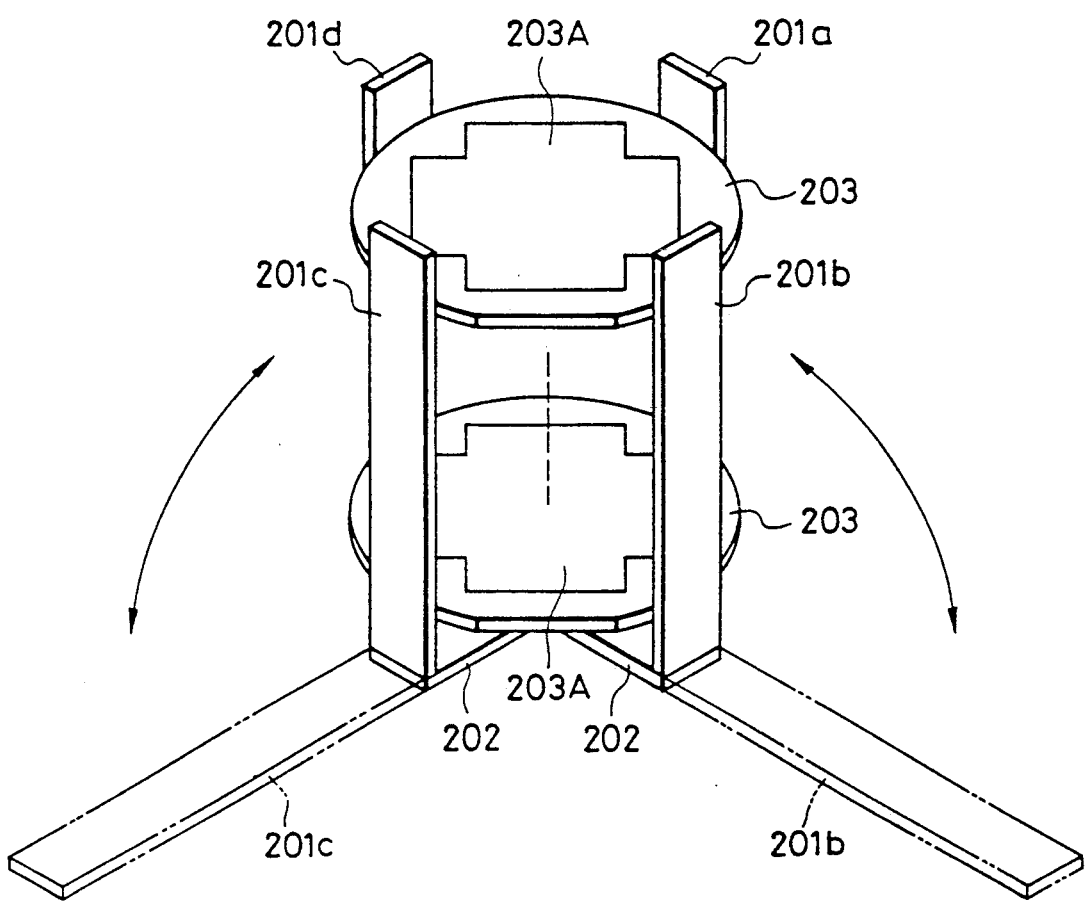
FIG. 2A is a perspective view of an entire packaging device.

In FIG. 2A, reference numeral 203 denotes a semiconductor wafer made of monocrystalline silicon, and reference numeral 203A indicates an integrated circuit region for constructing various integrated circuits.

A packaging device of a semiconductor integrated circuit according to the preferred embodiment includes pillars 201a, 201b, 201c and 201d standing at a peripheral portion of an integrated wafer 203, and a pillar connecting substrate 202 which is connected to the lower end portions of these pillars 201a to 201d so as to enable these pillars 201a to 201d to stand up stably. The pillars 201 and pillar connecting substrate 202 are made of a resin, such as an epoxy resin, or aluminum. Each semiconductor wafer 203 is sandwiched by semiconductor substrate supporting members 205 and 210 which are provided on each pillar 201. Among the above-described pillars 201a to 201d, the pillars, for instance, 201b and 201c are arranged to be bent, or brought down as shown in FIG. 2E. The remaining pillars 201a and 201d are fixed on the pillar connecting substrate 202. It should be noted that only the pillar 201a, three pillars 201a to 201c, or all of the pillars 201a to 201d may be bent or brought down. The pillars 201 other than the bendable pillars 201 are fixed on the pillar connecting substrate 202.

A description will now be made of a portion for supporting the semiconductor wafer 203 on the pillar 201.

Figure 2B:
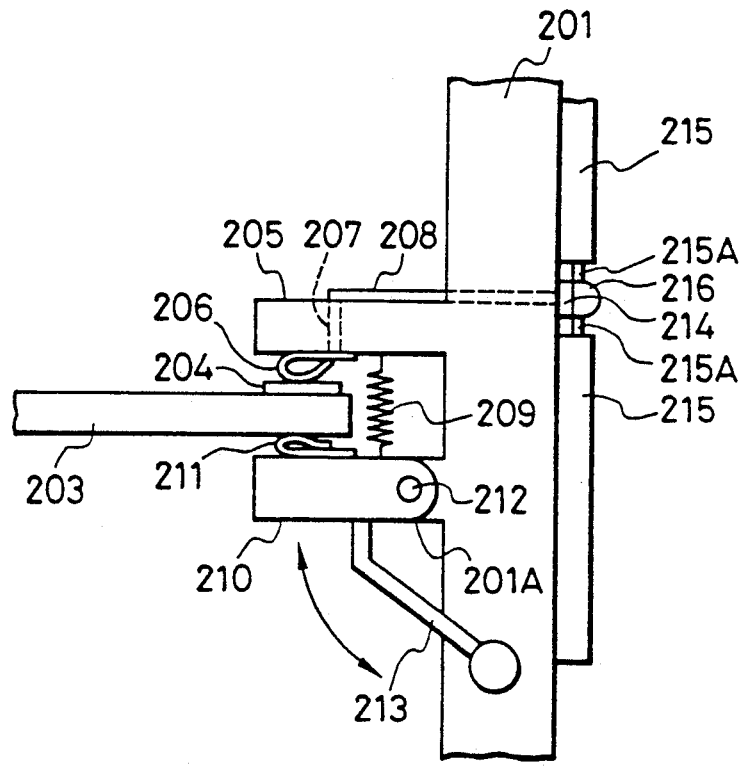
FIGS. 2B and 2C are side views of a semiconductor substrate supporting member.

In FIG. 2B, the semiconductor wafer 203 is supported by the upper semiconductor substrate supporting member 205 and the lower semiconductor substrate supporting member 210, mounted on the pillar 201 in a fixed condition. The upper semiconductor substrate supporting member 205 is made of, for instance, a resin such as an epoxy resin, or aluminum, and can be integrally formed with, for example, the pillar 201. The lower semiconductor substrate supporting member 210 is mounted on a supporting section 201A projecting from the pillar 201 in such a manner that it is rotatable around the supporting shaft 212. The lower semiconductor substrate supporting member 210 is made of, for instance, a resin such as a glass epoxy resin, or aluminum.

A plurality of hair-pin-shaped spring electrodes 206 are provided on the lower surface of the upper semiconductor substrate supporting member 205 so as to be resiliently connected to the electrode 204 of the semiconductor wafer 203. The spring electrode 206 is connected via an embedded wiring lead 207 which penetrates through the upper semiconductor substrate supporting member 205, and then via an upper wiring lead 208 on the upper surface of the upper semiconductor substrate supporting member 205, to a terminal electrode 214 provided on the outer wall of the pillar 201. The wiring lead 208 penetrates through a through hole formed through the pillar 201.

To achieve better contact between the lower semiconductor substrate supporting member 210 and the semiconductor wafer 203, a hair-pin-shaped pressure spring 211 is provided on the upper surface of the lower semiconductor substrate supporting member 210, i.e., the plane opposite to the semiconductor wafer 203.

By connecting a coil spring 209 between the upper semiconductor substrate supporting member 205 and the lower semiconductor substrate supporting member 210, both the force required for sandwiching the semiconductor wafer 203 by means of both the upper and lower semiconductor substrate supporting members 205 and 210, and also the force required for connecting the spring electrode 206 to the electrode 204 of the semiconductor wafer 203, can be provided. The portion of the lower semiconductor substrate supporting member 210 on which the coil spring 209 is located is at the side of the semiconductor wafer 203, rather than at the supporting axis 212. A handle 213 is mounted on the lower surface of the lower semiconductor substrate supporting member 210 so as to open a space defined between the upper and lower semiconductor substrate supporting members 205 and 210, when mounting the semiconductor wafer 203.

The above-described upper semiconductor substrate supporting member 205, lower semiconductor substrate supporting member 210, and coil spring 209 are mounted on the corresponding pillars 201a, 201b, 201c and 201d, so that the semiconductor wafer 203 can be sandwiched at four positions under a stable condition. Furthermore, the above-described spring electrode 206, wiring leads 207 and 208, coil spring 209 and pressure spring 211 are mounted on the respective upper and lower substrate supporting members 205 and 210 which are mounted on the corresponding four pillars 201. With respect to the spring electrode 206, the electrode 204 is arranged on the semiconductor wafer 203.

To the terminal electrode 214 at the outer wall of the pillars 201, a core 215A of a cable 215 which is covered with, e.g., vinyl chloride insulation, is connected by solder. This insulated cable 215 connects the respective semiconductor wafers 203, and the semiconductor wafers 203 packaged on the packaging substrate (on which the packaged device, i.e., the semiconductor wafer mounted on the packaging device, is mounted) and also the wiring lines on the packaging substrate.

Figure 2C:
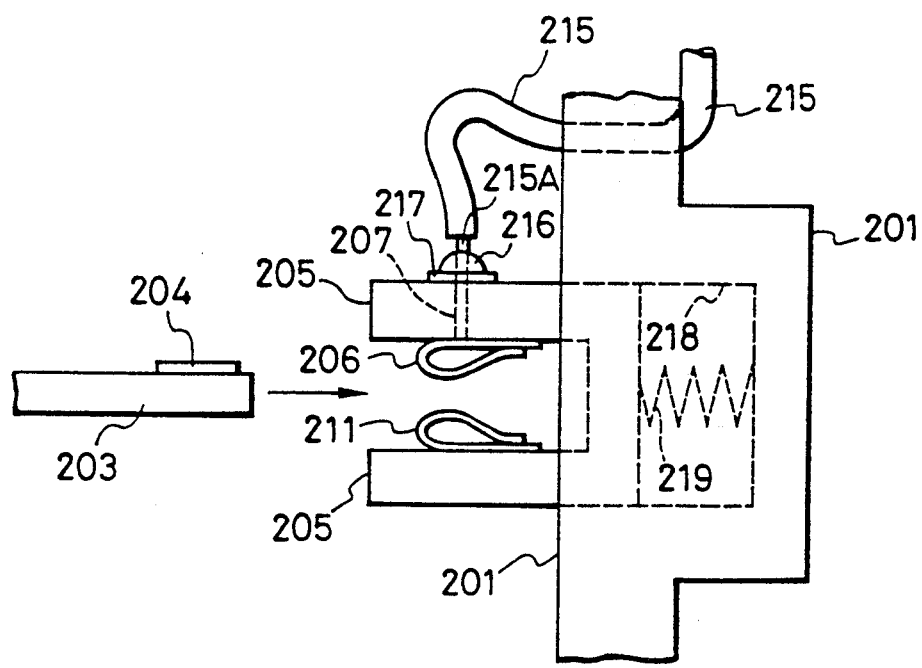

An alternative sandwiching member for the semiconductor wafer 203, as illustrated in FIG. 2C, is provided in such a manner that the semiconductor wafer supporting, or sandwiching member 205 is ]-shaped, and both the spring electrode 206 and pressure spring 211 are fixed on legs of the sandwiching member, on the inside surfaces of such legs. The pillars 201 define a cavity 218 of a cylindrical form at the portion corresponding to the semiconductor substrate supporting member 205 in order to fit in such cavity the semiconductor substrate supporting member 205. The semiconductor substrate supporting member 205 fitted within this cavity 218 is positioned to be pressed by the coil spring 219. A terminal electrode 217 is provided on the upper surface of the semiconductor substrate supporting member 205, to which the core 215A of the cable 215 is connected. The cable 215 extends over the plane opposite to the semiconductor wafer 203, i.e., the outer wall of the pillar 201. This cable 215 is connected via a through hole formed through the pillar 201, adjacent to the semiconductor substrate supporting member 205, to the terminal electrode 216. To achieve better connection between the spring electrode 206 and the electrode 204 and also firmly sandwich the semiconductor wafer 203, the space between the spring electrode 206 and pressure spring 211 when the semiconductor wafer 203 is not yet mounted is narrower than the thickness of the semiconductor wafer 203.

Figure 2D:
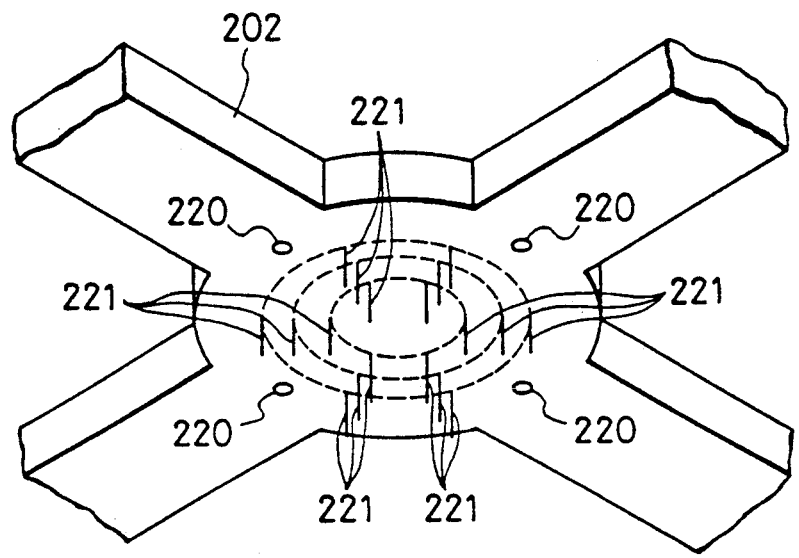
FIG. 2D is a perspective view of a pillar connecting substrate 2, which is observed from its bottom side.
Figure 2E:
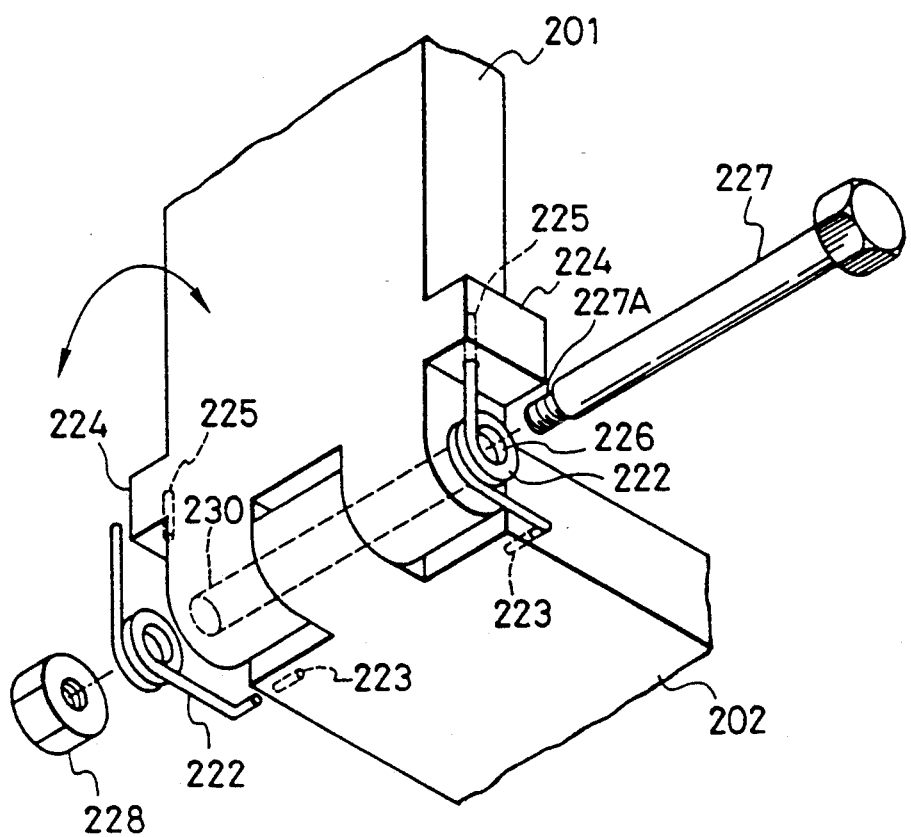
FIG. 2E is a perspective view of a connection part between the pillar and the pillar connecting substrate.

As illustrated in FIG. 2D, a plurality of connector pins 221 connected to the cable 215, as illustrated in FIG. 2B or 2C, are provided on the bottom of the pillar connecting substrate 202. These connector pins 221 are connected to the connector for a packaging substrate. Since the pillar connecting substrate 202 is mounted to the packaging substrate by screws during the packaging operation, a plurality of screw holes 220 are formed.

One example of a connection between the lower end portion of the pillar 201 and the pillar connecting substrate 202 is shown in FIG. 2E. As shown in FIG. 2E, the connecting portion of the pillar connecting substrate 202 is engaged with the lower portion of the pillar 201, and rotatably connected in such a manner that a mounting bolt 227 is inserted into the corresponding bolt hole 230 formed on these portions. The bolt 227 is so arranged that it is not dropped from the corresponding bolt hole 230 by mounting a nut 228 on the screw section 227. A twist coil spring 222 is positioned on both sides of the pillar and the bolt 227 is penetrated through the respective center holes 226 of the twist coil spring 222. One end of this twist coil spring 222 is mounted in the spring mounting hole 223 of the pillar connecting substrate 202, whereas the other end thereof is mounted in the spring mounting hole 225 formed on a projection 224 of the pillar 201. The pillar 201 can be stood up at a right angle by this twist coil spring 222, and also the bent pillar 201 can be recovered by means of the twist coil spring 222.

Figure 2F:
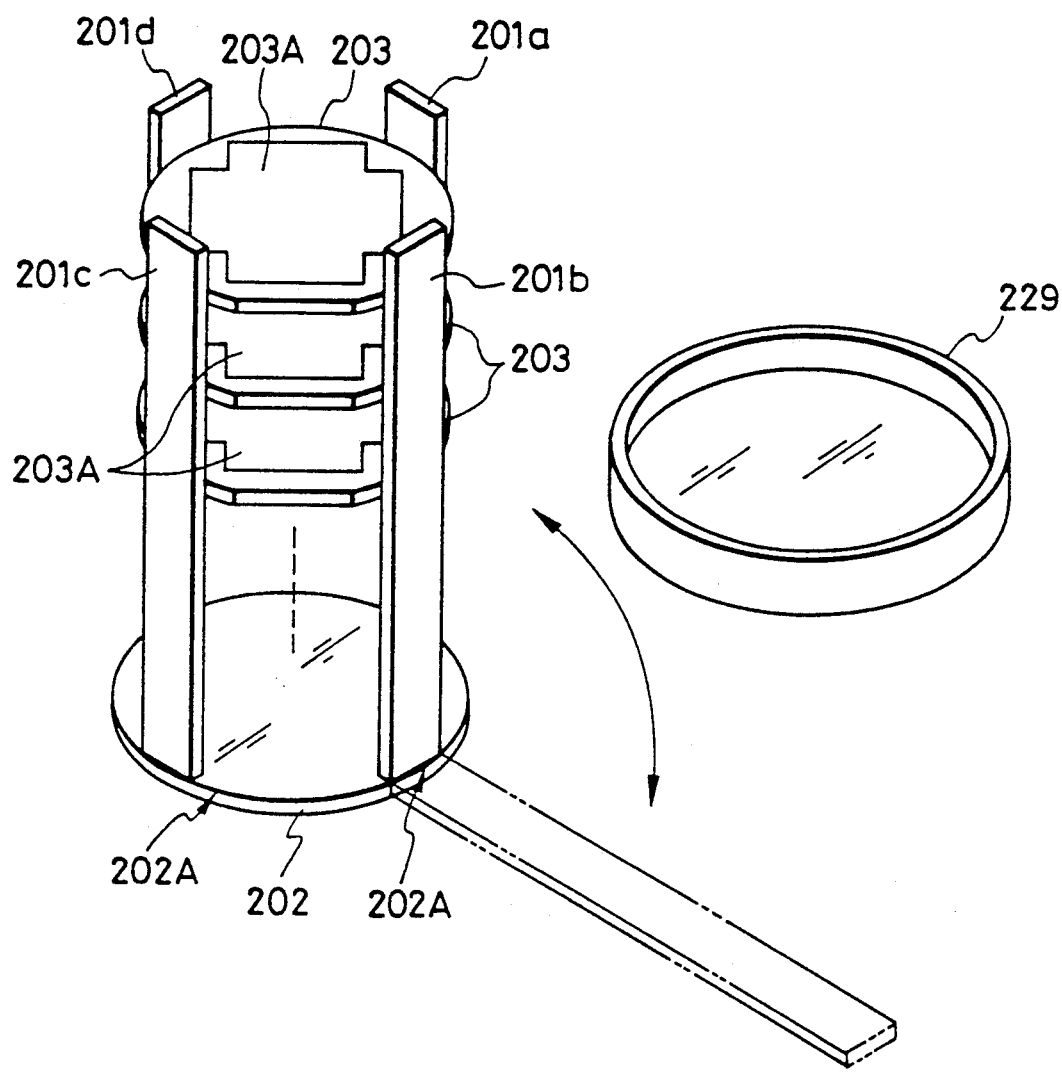
FIG. 2F is a perspective view of a modified packaging device.

It should be noted that both the pillar 201 and pillar connecting substrate 202 may be constructed as shown in FIG. 2F.

In FIG. 2F, one pillar 201b among four pillars 201 is so arranged to be bent. A hinge is mounted between the bent pillar 201b and the pillar connecting substrate 202 at the connecting sections 202A in such a manner that it is mounted between the outer wall of the pillar 201 and the edge portion of the pillar connecting substrate 202. Since the hinge is mounted to the outer wall of the pillar 201b, the pillar is not bent inside, but allowable to be bent outside. In order to prevent the standing pillar 201b from being bent inside, a lid 229 is employed to cover it. Also the semiconductor substrate supporting members 205, shown in FIG. 2B or 2C, and 210, are provided with the pillar 201 illustrated in FIG. 2F.

The following various merits can be achieved according to the above-described packaging device of the preferred embodiment.

(1) The packaging device is constructed of a plurality of pillars 201 which stand at the peripheral portion of the semiconductor wafer 203, the semiconductor substrate supporting members 205 or 210 are provided on the pillars 201, and the pillar connecting substrate 202 stably support the pillars 201. As a result, the semiconductor wafer 203 can be supported without twist and vibrations, so that a large-sized semiconductor integrated circuit constructed of the semiconductor wafer 203 can be packaged in the stable condition.

(2) Since the connector pins 221 are mounted on the bottom of the pillar connecting substrate 202, the integrated circuits can be connected to a packaging substrate in such a manner that the stable supporting condition for the semiconductor wafer 203 is not disturbed; in other words, the semiconductor wafer 203 is not bent.

(3) A spring electrode 206 is provided on the semiconductor substrate supporting member 205, with the result that the semiconductor wafer 203 can both be firmly held (sandwiched) and simultaneously be provided with electrical connection.

(4) As the electrode mounted on the semiconductor substrate supporting member 205 is used as the spring electrode 206, the sandwich effect of the semiconductor wafer 203 can be improved so as to electrically connect the corresponding portions.

(5) Since a twist coil spring 222 or lid 229 for standing the pillars 201 upright is employed, the pillars 201 may not be bent while supporting the semiconductor wafer 203, so that a stable supporting condition of the semiconductor wafer 203 can be maintained for a long time.

(6) A plurality of semiconductor wafers 203 can be mounted on the pillars 201, with the result that a large circuit system can be arranged with a smaller packaging area.

(7) Since at least one pillar 201 can be bent, the substrate wafer 203 can be mounted in the horizontal direction while bending the pillar 201. As a result, the semiconductor wafer 203 can be easily mounted.

While the present invention has been described using a specific embodiment, it should be noted that further modifications and changes can be made without departing from the scope of the present invention.

Rear surfaces of two of the semiconductor wafers 203 (that is, surfaces not provided with integrated circuit regions 203A), for instance, can be attached to each other, and the resultant semiconductor wafers 203 may be supported b either the semiconductor substrate supporting members 205 and 210 (see FIG. 2B), or 205 (FIG. 2C). In this case, the interval between the semiconductor supporting members 205, 210, and 205, into which the semiconductor waver 203 can be inserted, is made Wider than that of the single semiconductor wafer 203.

Also, the semiconductor wafer 203 is not limited to the above-mentioned wafer, but may be such a semiconductor substrate that, for example, the peripherals of the semiconductor wafer 203 are cut off to form a rectangular-shaped semiconductor wafer. In this case, the layout for arranging the respective pillars 201, and the size and shape of the pillar connecting substrate 202 may be modified, depending upon the size and shape of the employed semiconductor substrate.

The advantage achieved by the above-mentioned preferred embodiment will now be briefly described.

That is to say, since the packaging device is constructed of a plurality of pillars standing around the periphery of the semiconductor wafer, with the semiconductor substrate supporting members and pillar connecting members and pillar connecting substrate mounted thereto, the semiconductor wafer can be supported thereon without any twist and vibration phenomenon. As a consequence, a large-sized semiconductor integrated circuit constructed of a semiconductor wafer can be packaged under a stable condition.

Embodiment 3

Figure 3A:
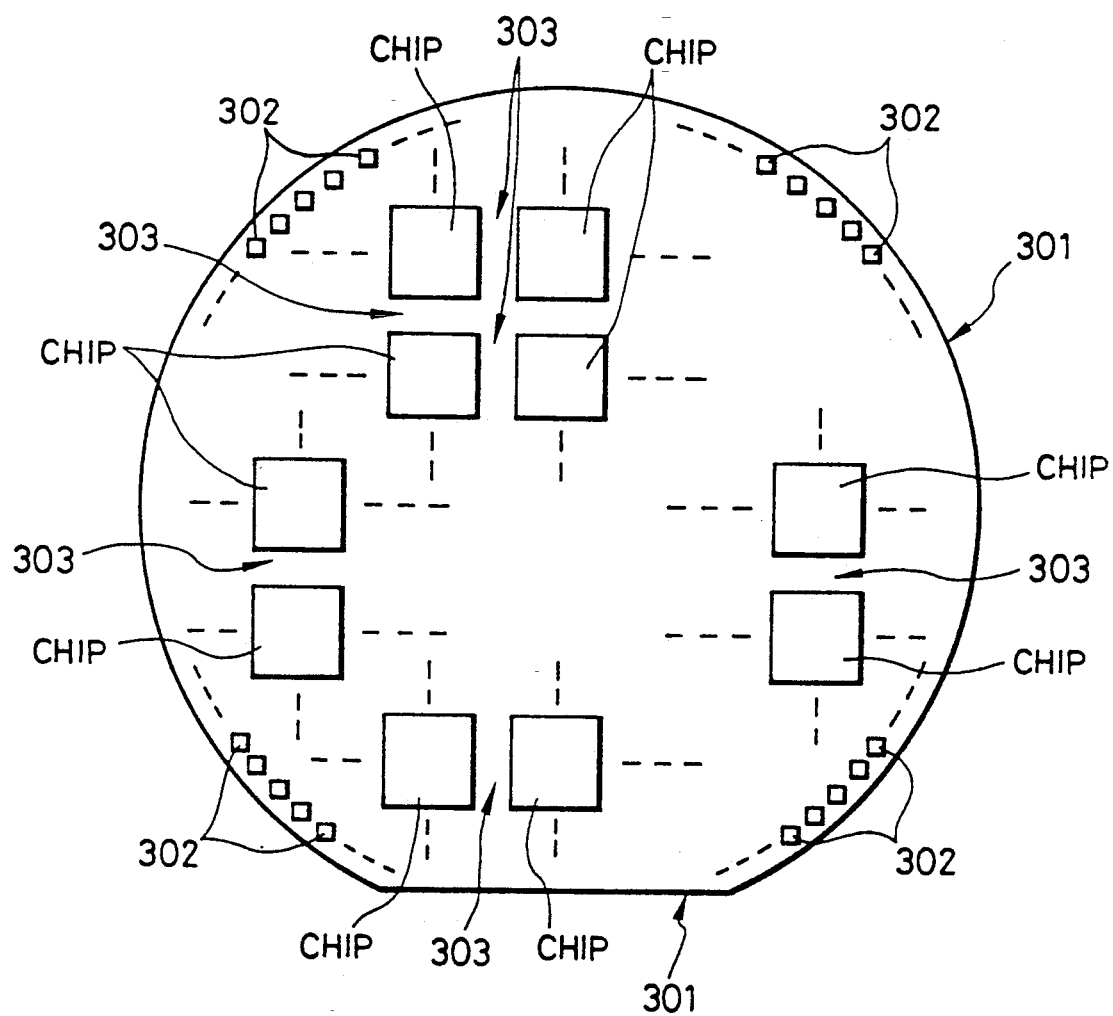
FIG. 3A is a plan view of a mounting substrate on which a plurality of semiconductor chips are mounted.
Figure 3B:
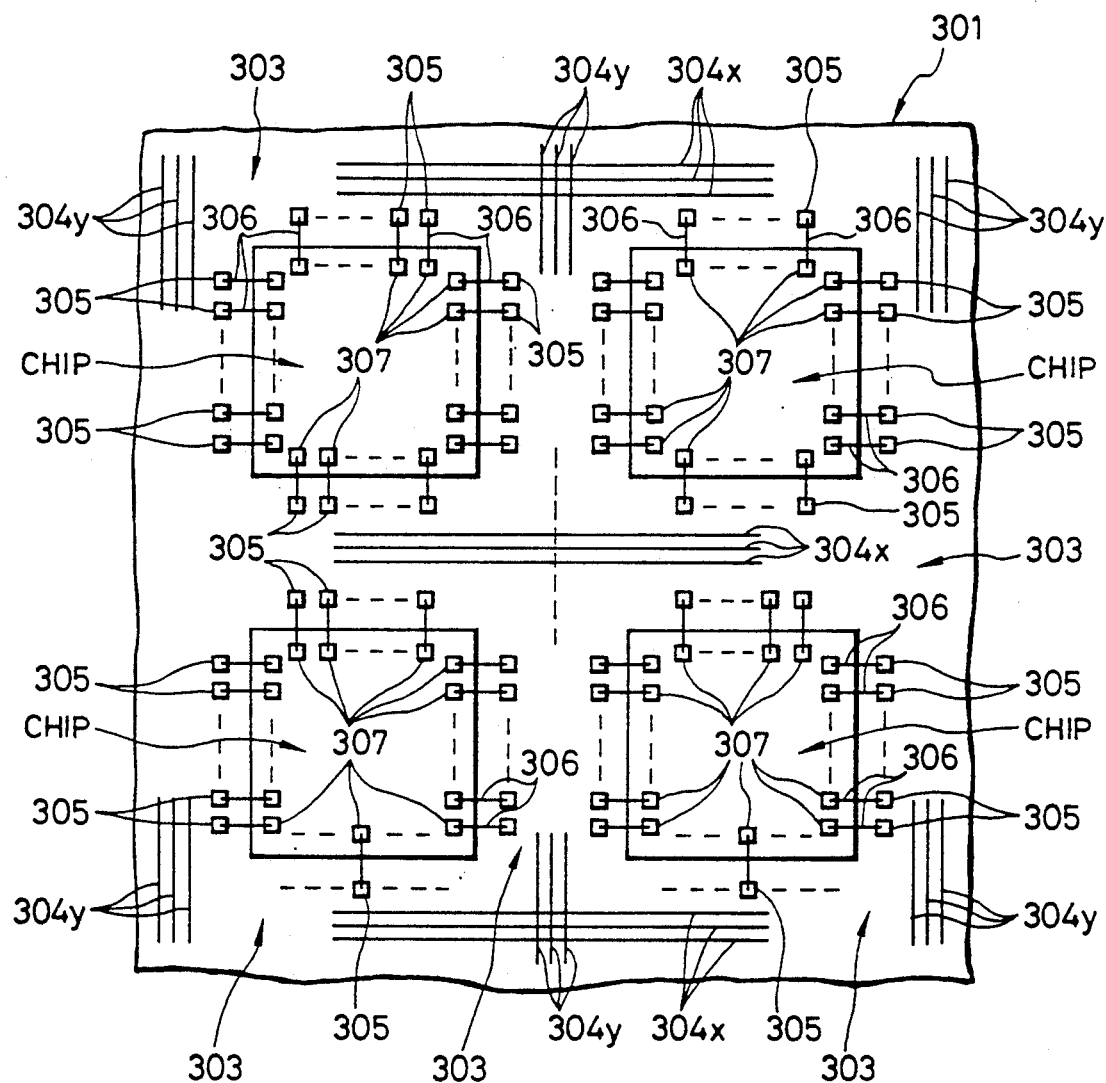
FIG. 3B is a plan view of a portion of the mounting substrate.

As illustrated in FIGS. 3A to 3C, the semiconductor device according to the preferred embodiment is so arranged that a plurality of semiconductor chips "Chip", made of a single crystal silicon, are mounted on a mounting substrate 301 made of a single-crystal semiconductor wafer. Between the respective semiconductor chips "Chip", there are provided a wiring region 303 consisting of a wiring line 304x made of an aluminum film as a first layer for connecting the semiconductor chips "Chip", and also a wiring line 304y made of an aluminum film as a second layer These first and second layers 304x and 304y extend in the wiring region 303. It is assumed that the direction along which the wiring line 304x extends is the X direction, and another direction, along which the wiring line 304y extends, is the Y direction. That is to say, the wiring lines 304x and 304y extend in such a manner that these lines intersect with each other. However, these wiring lines 304x and 304y do not extend underneath the semiconductor chips "Chip". The wiring line 304x of the first layer extends over an insulating film 308, of a silicon oxide film which is formed on the mounting substrate 301 by, for instance, the CVD method. An insulating film 309 made of a silicon oxide film formed by, for instance, the CVD method is employed to insulate between the wiring line 304x and the wiring line 304y of the second layer. In addition, a final protection film 310 made of a silicon oxide film which is formed by, for example, the CVD method, covers the wiring line 304y. It should be noted that the connection between the wiring line 304x and wiring line 304y is accomplished by a connecting hole which is formed by removing portions of the insulating film 309. At the peripheral portion of the mounting substrate 301, there are provided a plurality of bonding pads which are constructed by stacking the aluminum film 302x of the first layer and the aluminum film 302y of the second layer. The aluminum film 302x is overlaid on the insulating film 308, whereas another aluminum film 302y is connected to the aluminum wiring film 302x via a connecting hole 311 which is formed by removing portions of the insulating film 309. Either the above-described wiring line 304x or 304y is connected to the bonding pads 302. When the wiring line 304x is connected to the bonding pad 302, this wiring line 304x is integrally formed with the aluminum film 302x which constitutes the lower portion of the bonding pad 302. When the wiring line 304y is connected to the bonding pad 302, this wiring line 304y is integrally formed with the aluminum film 302y which constitutes the upper portion of the bonding pad 302. The final protection film 310 has been removed when overlaying the bonding pad 302, and then becomes an opening 312.

Around the periphery of the semiconductor chips "Chip" on the mounting substrate 301, a plurality of bonding pads 305 are formed by stacking the aluminum layer 305x of the first layer and the aluminum layer 305y of the second layer. The aluminum film 305x is located over the insulating film 308. The aluminum film 305y is connected via the connecting hole 311 to another aluminum film 305x. The bonding pad 305 is exposed through the opening 312. Either wiring line 304x or wiring line 304y is connected to the bonding pad 305. When the wiring line 304x is connected to the bonding pad 305, the aluminum film 305 constituting the lower portion of this bonding pad 305 is integrally formed with the wiring line 304x. When the wiring line 304y is connected to the bonding pad 305, the aluminum layer 305y constituting the upper portion of this bonding pad 305 is integrally formed with the wiring line 304y. On the surface of the mounting substrate 301, no element such as an MISFET, bipolar transistor, resistor element, capacitive element and so on is constructed. However, either resistor elements or capacitive elements may be formed in the surface portion of the mounting substrate 301 on a portion of the mounting substrate other than the region on which the semiconductor chips "Chip" are mounted.

The semiconductor chips "Chip" are attached on the final protection film 310 by means of an adhesive agent 313 such as a silicone rubber. Stress applied to the semiconductor chips "Chip" can be reduced by introducing the silicone rubber into the adhesive agent. A plurality of bonding pads 307 are arranged around the peripheral portion of the semiconductor chips "Chip". Each bonding pad 307 is so constructed by stacking up, for instance, an aluminum film of the first layer and an aluminum film of a second layer. It should be noted that a large number of MISFETs, bipolar transistors, resistor elements and capacitive elements are provided on the surface of the semiconductor chips "Chip".

To separate these elements on the semiconductor chips "Chip", a field insulating film made of a silicon oxide film is formed by way of, for instance, thermal oxidation, on the chip. Moreover, to interconnect these elements, wiring lines made of a polycrystalline silicon film, formed, e.g., by the CVD method, or an aluminum film formed, e.g., by the sputtering treatment, are provided over the chip. An insulating film made of a silicon oxide film formed by, for example, the CVD method is employed to provide electrical insulation between an upper wiring line and a lower wiring line on the chip. That is to say, although not shown in figures, underneath the aluminum layer of the first layer which constitutes the lower portion of the bonding pad 307, there is employed an insulating film of a first layer which is made of a silicon oxide film formed by, for instance, the CVD method, and covers, for example, the MISFET's gate electrode. The upper portions of the semiconductor chips "Chip" are covered with a final protection film 314 which is formed by stacking a silicon oxide film and a coating glass (SOG) film formed by the CVD method, or a silicon nitride film formed by a sputtering treatment, as known in the art. This final protection film 314 has been selectively removed on the bonding pad 307 to form opening 315, so that bonding pad 307 is exposed.

Between the bonding pad 307 of the semiconductor chips "Chip" and the bonding pad 305 of the mounting substrate 301, a bonding wire 306 is connected, which is made of an aluminum wire on which, for instance, a gold layer and a silver layer have been plated. The connection between the bonding wire 306 and the bonding pad 307, and also the connection between the bonding wire 306 and the bonding pad 305, is performed by means, for instance, the ultrasonic bonding, thermal contacting and so on, as known in the art.

A bonding wire 316 made of an aluminum wire on which, for instance, a gold layer, or a silver layer has been plated, is connected to the bonding pad 302 provided around the peripheral portion of the mounting substrate 301. This bonding wire 316 is connected to a lead 320 made of a 42 alloy, as illustrated in FIG. 3D.

Figure 3D:
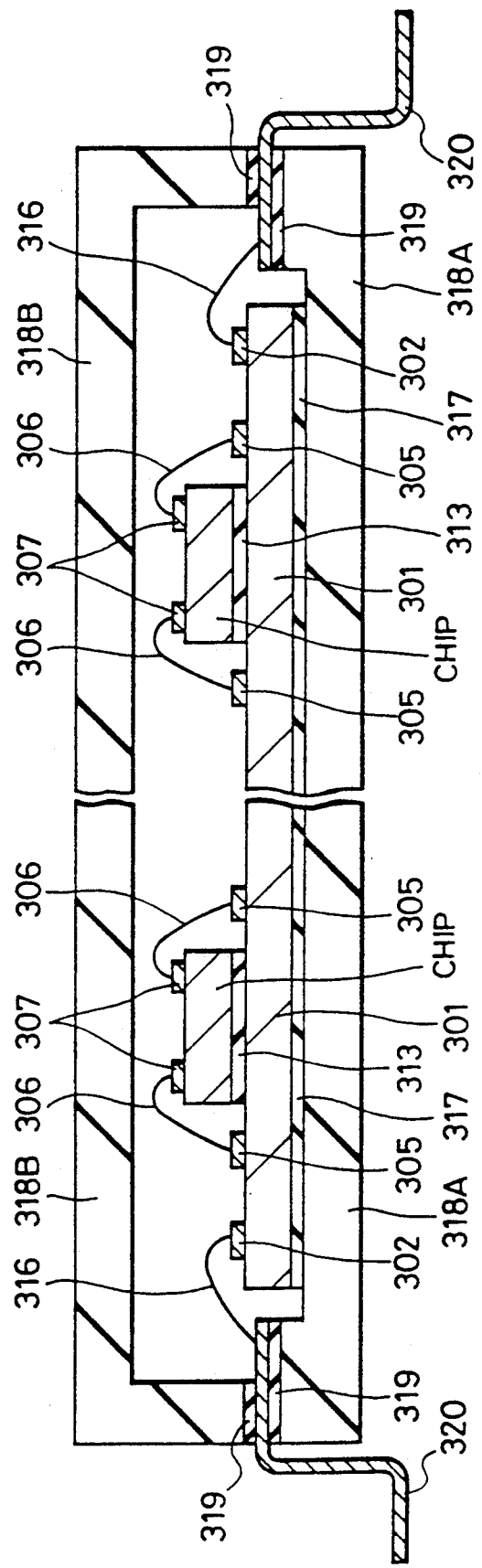
FIG. 3D is a sectional view of a package for sealing the mounting substrate.

In FIG. 3D, there is shown a sectional view of the mounting substrate 301, the package substrate 318A for sealing the semiconductor chips "Chip", and the package cap 318B.

In FIG. 3D, the packaging substrate 318A is made of, for instance, a ceramic material, alumina, etc. The package cap 318B is made of, for example, a ceramic material. The mounting substrate 301 is attached to the packaging substrate 318A by means of an adhesive agent 317 made of, for instance, a silicone rubber. By employing the silicone rubber in the adhesive agent 317, stress applied to the mounting substrate 301 made of a single crystal silicon can be reduced. The packaging substrate 318A is attached to the package cap 318B by means of a sealing agent 319 made of, for instance, glass, as known in the art. A gap between the packaging substrate 318A and the packaging cap 318B formed by a lead 320 is sealed by the sealing agent 319.

It should be noted that the adhesive connection between the semiconductor chips "Chip" and the mounting substrate 301 may be accomplished in such a manner that the insulating films 308 and 309 underneath the semiconductor chips "Chip", and the final protection film 310, are selectively removed to expose the surface of the mounting substrate 301, and these semiconductor chips "Chip" are connected to the exposed region by means of the adhesive agent 313.

Furthermore, the adhesive connection between the semiconductor chips "Chip" and the mounting substrate 301 may be accomplished by employing, for example, an Au paste.

In accordance with the above-described preferred embodiment, there are provided the following advantages.

Since the electrical connection between the semiconductor chips "Chip" and the mounting substrate 301 is performed by employing the bonding pad 307, bonding wire 306 and bonding pad 305, the reliability of the electrical connection between the semiconductor chips "Chip" and the mounting substrate 301 can be improved due to the fact that a rigid connection between these parts is established.

Then, as the rear surface of the semiconductor chips "Chip", i.e., the surface opposite to another surface on which the bonding pad 307 is mounted, is connected to the mounting substrate 301 by the adhesive agent, the heat produced in the semiconductor chips "Chip" can be radiated via the mounting substrate 301 to the packaging substrate 318A, and furthermore to the atmosphere. This implies that a higher heat radiation effect can be realized because the semiconductor chips "Chip" are not separated from the mounting substrate 301. This effect can be specifically improved in such a semiconductor device where a plurality of semiconductor chips "Chip" are sealed within the same package (318A, 318B).

Since the mounting substrate 301 is made of the same material, i.e., single crystal silicon, as that of the semiconductor chips "Chip", a difference in the thermal expansion between the mounting substrate and the semiconductor chips mounted thereon can be reduced to zero.

In addition, since the semiconductor chips "Chip" and the mounting substrate 301 are connected to each other by the bonding wire 306, tolerance for positioning of the semiconductor chips "Chip" and the mounting substrate 301 can be made large.

Since a semiconductor wafer is used as the mounting substrate 301, no stress concentration is introduced into the mounting substrate 301, so that no damage is made in the mounting substrate 301, which can improve the reliability.

While the present invention has been described using a specific embodiment, the present invention is not limited to the above-described embodiment, but may be modified and changed without departing from the technical scope and spirit of the invention.

For instance, the mounting substrate 301 need not be made of a semiconductor wafer, but may be formed as a rectangular mounting substrate 301, the peripheral portions of which are cut off.

Moreover, the semiconductor integrated circuit device according to the preferred embodiment may be built within an IC (integrated circuit) card. In this case, the size of the mounting substrate 301 is made small enough to store the mounting substrate 301 within the IC card, so that a plurality of semiconductor chips "Chip" are mounted thereon. The bonding wire 306, and the bonding pads 307 and 305, are employed to connect between this semiconductor chip "Chip" and the mounting substrate 301. The semiconductor integrated circuit device is not sealed in the package substrate 318A and package cap 318B, but stored in the IC card.

The effects obtained by the above-described preferred embodiment will now be briefly described.

Since a bonding wire is employed to connect between the semiconductor chip and the mounting substrate, the reliability of the electrical connection between the semiconductor chip and the mounting substrate can be improved.

Also, since the rear surface of the semiconductor chip (i.e., the surface thereof located opposite to another surface on which the bonding pad is provided) is attached to the mounting substrate, the heat generated in the semiconductor chip can be radiated via the mounting substrate to the package, and in turn to the atmosphere. In other words, the radiation effect can be improved.

Embodiment 4

Figure 4A:
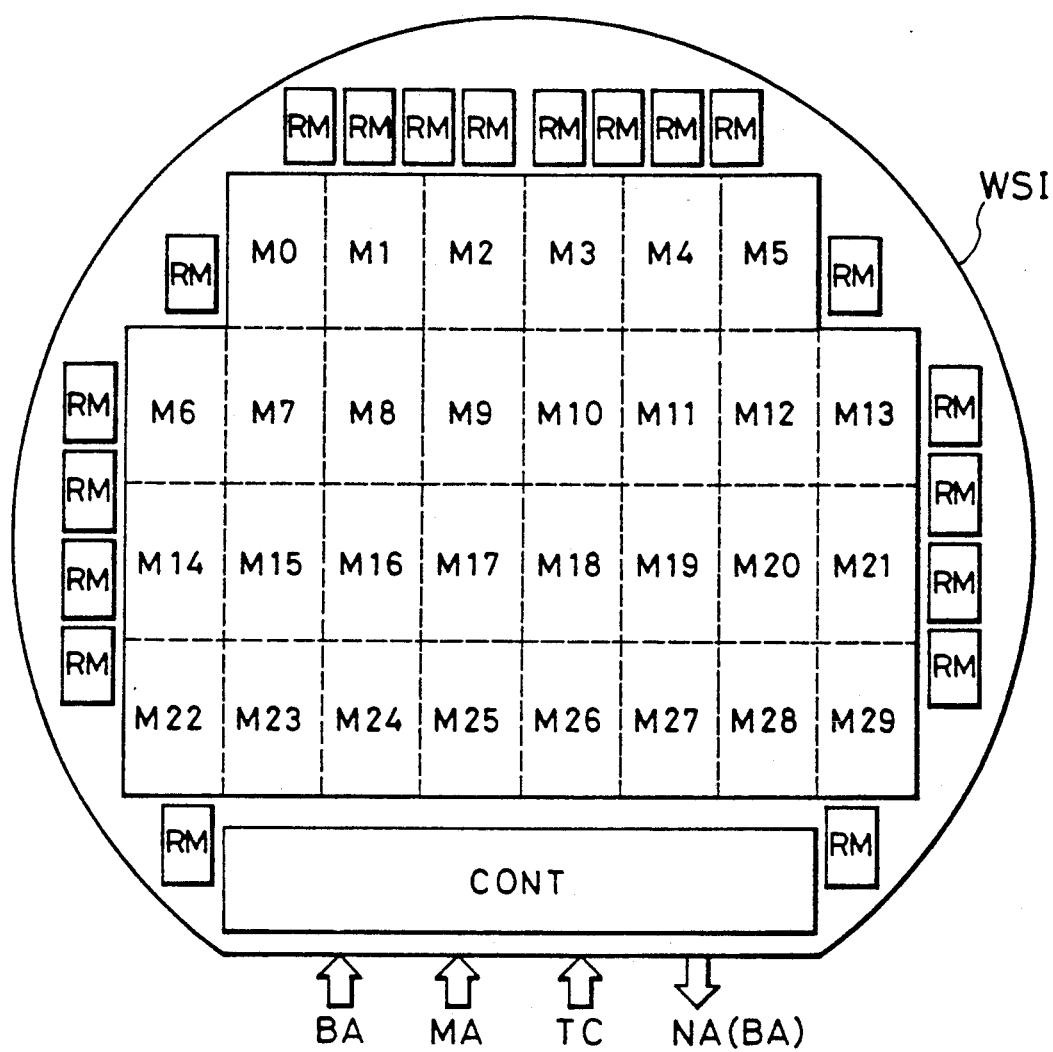
FIG. 4A is a schematic block diagram of a memory system, according to one preferred embodiment to which the present invention is applied.

In FIG. 4A, there is shown a block diagram of one preferred embodiment in which the present invention is applied to a wafer-scale semiconductor memory device. Each of the circuit blocks shown in FIG. 4A is formed based upon a known manufacturing technique for a semiconductor integrated circuit. Each of the circuit blocks shown in FIG. 4A is drawn, taking account of the practical geometric circuit arrangement on a wafer-scale WSI (wafer-scale semiconductor integrated circuit device).

Figure 4B:
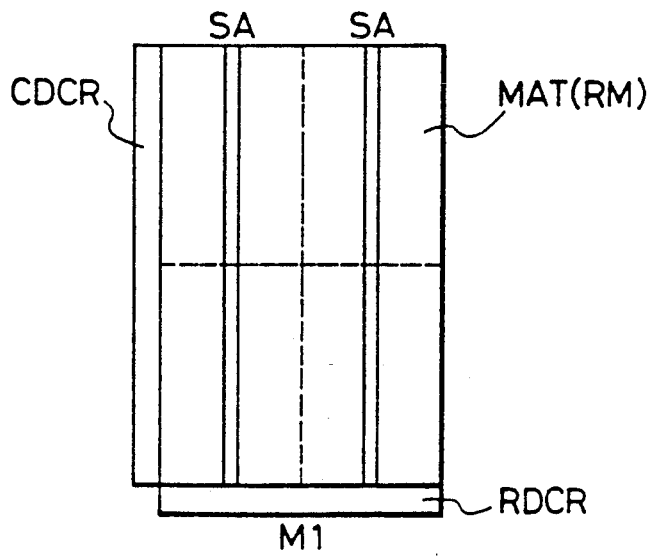
FIG. 4B is a schematic block diagram of a memory block according to a preferred embodiment.

The memory blocks MO to M29 are not specifically limited, but are constructed of memory arrays constituting dynamic type RAM's (random access memories), and also decoder circuits for performing their selecting operation. That is to say, as shown in FIG. 4B, the memory block Mi is, briefly speaking, constructed of a memory array, a column decoder CDCR for selecting its data line (bit line, or digit line), and a row decoder RDCR for selecting its word line. As represented by a dotted vertical line in FIG. 4B, the memory array is subdivided into two memory mats, in principle. A shared sense amplifier SA is arranged on each center portion of the respective memory mats. Such a shared sense amplifier is disclosed in U.S. patent application Ser. No. 729,859, filed May 2, 1985 (note particularly FIG. 4 thereof), the contents of which in its entirety is incorporated herein by reference. Since such a shared sense amplifier system is employed where the sense amplifier SA is arranged on the center portion of the memory mats, a switch circuit may be employed for selectively connecting this sense amplifier to either memory mat (not shown in detail). Although not shown in the figures, a column switch circuit may be provided in parallel to this sense amplifier. It should be noted that the above-described memory block Mi includes various circuits (not shown in detail). These arrangements of the memory array and the address selecting circuit may be constructed of a circuit equivalent to the known dynamic type RAM. In the preferred embodiment, the memory array is also subdivided vertically to obtain two divided portions as illustrated in FIG. 4B, for the sake of convenience. As described above, one memory mat divided into four parts corresponds to spare memory circuits RM for redundancy as described below.

The above-described memory blocks M0 to M29 require a relatively large rectangular area to be occupied. Accordingly, an empty space is produced around the peripheral portion of a substantially circular wafer WSI. To utilize this empty space, the above-described preliminary memory circuit RM is so designed as to occupy a relative smaller area where there are a memory array section corresponding to the memory mats subdivided from one memory block, and a decoder circuit thereof. As a result, a large quantity of the above-described preliminary memory circuits RM are formed at the peripheral portion of the wafer on which the memory block Mi required to have the relatively large occupied area can be formed. Such a circuit arrangement can prevent the practical memory capacity from being reduced when adding the redundant circuit. In other words, while adding the redundant functions, a memory system having a larger memory capacity can be obtained.

Although the present invention is not restricted, a control circuit CONT may be arranged at a position corresponding to an orientation flat section of the wafer WSI. This control circuit CONT performs the selection operation of the above-described memory block Mi by receiving address signals BA and MA and a control signal TC supplied from an external source. To this end, an electrode to be connected to the above external source is provided on the above-described orientation flat section. This electrode is utilized for the probe test when the memory system constituted by the above-described memory block circuit RM and also control circuit CONT formed on the wafer WSI is accomplished. The address signal BA among the above-described address signals corresponds to a block address signal for designating one of the memory blocks M0 to M29. The address signal MA corresponds to an address signal commonly supplied to the above-described respective memory blocks M0 to M29. Therefore, the control circuit CONT includes a decoder circuit for producing a selection signal for one memory block, while receiving the above-described block address signal BA. Between the above-described control circuit CONT and the respective memory blocks M0 to M29, there are arranged an address supply line for supplying the above-described common address signal MA, a signal line for supplying and receiving a read/write signal between the respective memory blocks M0 to M29, a timing signal for controlling various operations, and a selecting signal line formed by decoding the above-described block address signal BA. Due to complex circuitry, such signal lines are omitted in the figures. Furthermore, there are employed an address supply line for supplying an address signal with respect to the above-described preliminary memory circuit RM, a signal line for receiving/supplying a read/write signal between the respective preliminary memory circuits RM, and a signal line for the same timing signal and selection signal as in the above case. However, since the preliminary memory circuit RM has only $\frac{1}{4}$ memory capacity, as compared with the memory capacity of one memory block Mi, the address setting operation and also the allocation of the selecting signal line can be performed by a program. The address signal, except for the respective most significant bits of the row/column with respect to the above-described memory block Mi, is supplied to the respective decoder circuits. The selection signal line for the respective preliminary memory circuits RM is provided in one-to-one correspondence with the control circuit CONT. This selection signal line is designated by combining the block address signal designated under control of the control circuit CONT with the remaining higher 2-bit address signal. As a consequence, one preliminary memory circuit RM is allocated to the address block and the higher 2-bit memory address by the address designation at the control circuit CONT.

As the invention is not limited to the following embodiment, the control circuit CONT performs the memory access with respect to the respective memory blocks M0 to M29 and owns such a function that while judging whether or not the defect is present, it sends out externally a failed address signal NA(block address) corresponding to the failed memory block.

The operation per se of the above-described memory system is similar to that of the conventional board-arranged memory device wherein the memory block is constructed of one semiconductor integrated circuit device, and the wafer WSI is substituted by a printed substrate.

In a memory system according to the preferred embodiment, the block addresses are allocated to the respective memory blocks. As a consequence, when a defect is present in, for example, one memory block Mi, the memory block Mi essentially containing such a defect can be separated by invalidating the corresponding selection signal. It should be, however, noted that if a serious defect occurs such that a shortcircuit problem is present between the power supply line and the ground line of the circuit, the power supply line should be separated by projecting a laser ray, as done in a conventional system. Also in this case, since this defect can be discovered by the memory access from the control circuit CONT, and its failed address (block address) NA is externally derived, the above-described defect relieving can be relatively simply performed. Moreover, even if the defect occurs in one word line at the memory block and the data line connected to the memory cell, similarly the failed address NA is outputted, so that the program for relieving a defect can be made readily.

The above-described defect relieving operation by employing the above-described preliminary memory circuit RM, is performed for every memory block according to the most simple way. That is to say, the selection is prohibited by cutting off, for instance, fuse means with respect to the memory block containing the defect. Then, the block address is stored in the memory circuit which utilizes the fuse means; when the memory address corresponding to the block address is detected, one memory block is constructed by four preliminary memory circuits RM, and thereafter this memory block is selected. Such a selection for the redundant circuit can be accomplished by utilizing the defect relieving technique which is performed at the word line or data line unit in the conventional dynamic type RAM.

When there is a defect in one memory mat among the above-described ¼-divided memory mats of one memory block, the selection for the defective memory mat is detected while the remaining three memory mats remain alive, so that the selection is carried out for the above-described preliminary memory circuit. In this case, the defective, or failed, address is designated in the control circuit CONT as the defective, or failed, address based upon the block address and the respective 1-bit most significant bit of the row system and column system, in other words, the 2-bit address signal for designating one memory mat among the subdivided four memory mats MAT. When detecting the memory access with respect to this failed address, the supply of the selection signal for its memory block is prohibited, and the corresponding preliminary memory circuit RM is selected. Such a selection signal can be provided, for example, by a computer program. In this case, since each of these preliminary memory circuits RM can be independently used, the redundancy can be increased.

The various advantages achieved in the preferred embodiment will now be summarized.

(1) According to the preferred embodiment, a plurality of circuit blocks each having a specific circuit function are employed, and the block address for designating the respective circuit blocks is allocated thereto, so that the system can be built up on the wafer. As a result, the independent function test for each of the circuit blocks can be done by designating the above-described block address, and the practical separation for the defective, or failed, block can be performed by employing the above-described block address. Consequently, it is possible to omit the first conventional step where the connecting wire is cut out by irradiating laser rays with respect to the failed block, and the wire is connected to the non-defective block.

(2) In a memory system where the circuit block having the specific circuit function is constituted by the memory array and the decoder circuit, this memory system is constructed of a plurality of mats and also of preliminary memory circuits corresponding to the subdivided mats. As a result, since the area occupied by the preliminary memory circuits can be made small, the preliminary memory circuits can be formed around the wafer peripheral portion where the above-described memory blocks cannot be formed. Consequently, as the entire surface of the wafer can be utilized, the memory capacity of the memory system can be essentially increased while adding the redundant function thereto.

(3) The area occupied by the above-described preliminary memory circuit can be made small, so that the practical redundancy can be increased since a failure occurrence rate in the preliminary memory circuit can be reduced.

(4) In the preferred embodiment, the block address is allocated to the above-described memory blocks so as to perform the selection operation, so that cutting out, or electrically separating, the defective memory block from the main memory circuit can be electrically performed by employing the above-described block address. The specific manufacturing step such as the step for irradiating laser rays and also wiring can be omitted.

(5) The probe test can be omitted by performing the function test while designating the respective memory blocks from the control circuit. Accordingly, a higher test efficiency can be achieved, and also occurrence of defects caused by probing the electrodes of the respective circuit blocks, i.e., the break down of the electrodes, can be avoided. As a consequence, the product yield of the semiconductor integrated circuit device can be improved.

(6) The defect relieving process can be performed at a higher efficiency by outputting the address signal (block address) corresponding to the defective memory block.

While the present invention has been described using a specific preferred embodiment, the present invention is not limited thereto, but may be modified, changed, or substituted without departing from the technical scope and spirit of the invention.

As the detailed arrangement of a single memory block, not only the above-described shared sense amplifier system, but also the sense amplifier arrangement located at the end portion of the data line and other various types of system may be utilized. The memory block may be constructed of the above-described dynamic type RAM, but also a static type RAM. Moreover, it may be possible to simultaneously employ a dynamic type RAM, static type RAM and mask ROM (read only memory).

As the circuit blocks having the specific circuit function, not only the above-described memory blocks, but also a peripheral circuit constituting a microcomputer system may be utilized. In this case, the circuit block containing the defect can be essentially separated from the system by allocating the above-described block address.

It should be noted that the present invention can be widely applied to a VLSI which is constructed of a wafer-scale substrate.

The effects achieved by the above-mentioned preferred embodiment will now be briefly described. That is to say, the system can be built up on a wafer by providing a plurality of circuit blocks having the specific circuit functions, and allocating the block address to designate the respective circuit blocks. Therefore, it is possible to perform the function test for the respective circuit blocks by designating the block address. Also by employing the above-defined block address, the defective, or failed, circuit block can be practically cut out from the main circuit block. As a consequence, the conventional steps for cutting off the wiring line by irradiating the laser beams time to time, and for wiring the effective circuit blocks can be omitted.

Embodiment 5

Figure 5A:
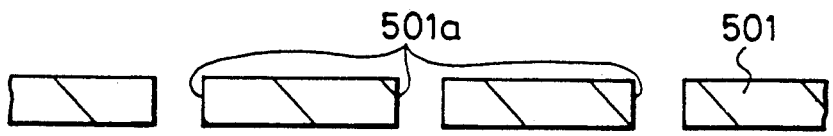
FIGS. 5A to 5C are sectional views for explaining a manufacturing method of the packaging substrate in the order of the manufacturing steps.

As shown in FIG. 5A, for instance, an electron beam is first irradiated to a substrate 501 such as a silicon substrate, so that a large quantity of fine through holes having, for example, a diameter of 100 μm are formed therethrough. This electron beam irradiation can be performed by employing, for instance, an electron-beam direct exposure apparatus having a large-sized electron gun. As a result, these through holes 501a can be formed at very precise positioning. Accordingly, as the interval between the adjacent through holes 501a can be reduced to, for instance, on the order to 200 μm, an input/output pin 509 (see FIG. 5D) can be arranged in high density (will be described later). As a result, a multi-pin arrangement can be realized. It should be noted that instead of the above electron beam, an ion beam may be employed.

Figure 5B:
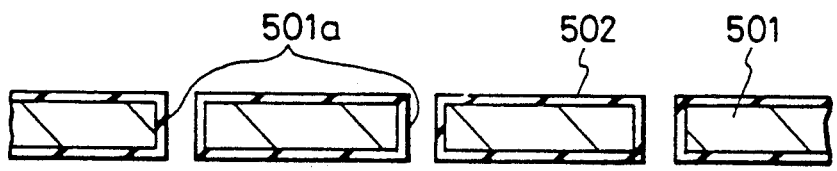

As shown in FIG. 5B, the above-described semiconductor substrate 501 is thermally oxidized so as to form an insulating film 502, such as a SiO$_2$ film, over the entire surface including the inner peripheral surface of each through hole 501a.

Figure 5C:
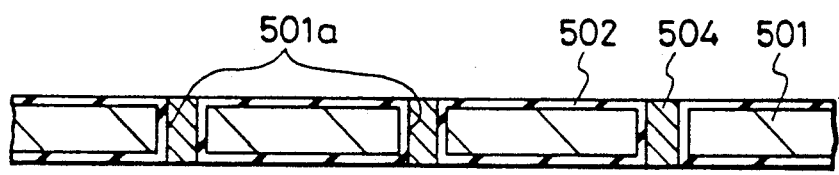
Figure 5D:
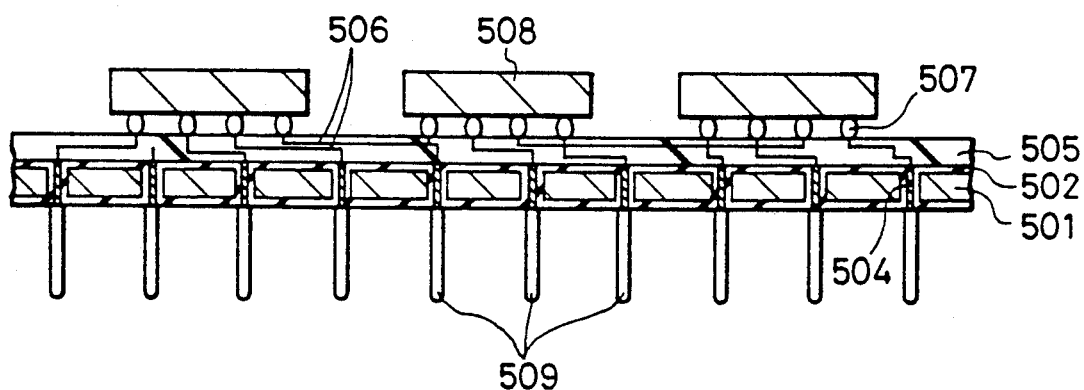
FIGS. 5D is a sectional view for indicating a multi-chip module which packages an LSI chip by employing the packaging substrate that is manufactured according to the manufacturing method of the packaging substrate, as illustrated in FIGS. 5A to 5C.
Figure 5E:
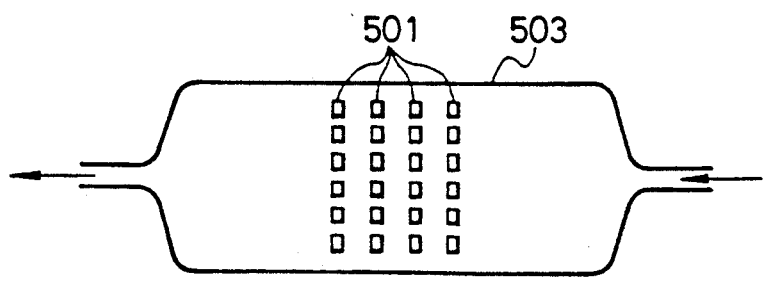
FIG. 5E illustrates a method for forming the connecting wire, based upon a CVD (chemical vapor deposition) method, with respect to the method for manufacturing the packaging substrate, as illustrated in FIGS. 5A to 5C.

Thereafter, the above-described semiconductor substrate 501 is stored in a reaction tube 503 of a CVD apparatus as illustrated in, for example, FIG. 5E. While this semiconductor substrate 501 is heated to a predetermined temperature, both, for instance, tungsten hexafluoride (WF$_6$) and hydrogen (H$_2$) are passed from one end of this reaction tube 503 toward the semiconductor substrate 501 in the perpendicular direction. Then, the gas phase reaction expressed by the following formula is carried out:

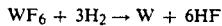

$$WF_6 + 3H_2 \rightarrow W + 6HF$$

During the reaction step, the above-described reaction gas flows through each through hole 501a of the semiconductor substrate 501, and tungsten is deposited in the through holes. Since, as shown in FIG. 5C, tungsten (W) is deposited which is produced in this gas phase reaction, the interior of the through hole 501a is filled with tungsten, and then, the connecting wire 504 can be formed which is insulated by the insulating film 502 from semiconductor substrate 501. It should be noted that since tungsten is practically deposited not only on the through hole 501a, but also on the surface of the insulating film 502 not in the through holes, during the gas reaction, both surfaces of the semiconductor substrate 501 are polished to remove the unnecessary tungsten deposition after depositing tungsten. FIG. 5C illustrates the condition after polishing the substrate.

FIG. 5D illustrates a so-called multi-chip module where the semiconductor substrate 501 thus formed is utilized as the packaging substrate. As illustrated in FIG. 5D, in such a multi-chip module, a multi-layer wiring line 506 made of, for example, an aluminum wiring line is formed on the above-described semiconductor substrate 501 by insulating the respective layer wiring lines by employing an insulating material such as a polyimide resin 505. At one end portion of this multi-layer wiring line 506, for example, a solder bump 507 is formed. A plurality of LSI chips 508 such as silicon chips are packaged via these solder bumps 507. It should be noted that the above-described solder bump 507 is connected to a bonding pad (not shown) provided on the LSI chip 508. This LSI chip 508 is connected to the input/output pin 509 by means of the above-described multi-layer wiring line 506 and connecting wire 504.

Since in accordance with the multi-chip module shown in FIG. 5D, both the packaging substrate constructed of the semiconductor substrate 501 and the LSI chips 508 are made of the same material (e.g., silicon), there is no difference in the thermal expansion coefficient between the packaging substrate and the LSI chips 508. Consequently, it is possible to prevent occurrence of thermal stress at the solder bump section 507 due to this difference of the thermal expansion coefficient. As a result, a temperature cycle life can be improved and also a large-sized LSI chip can be utilized.

While the present invention has been described employing a specific preferred embodiment. The present invention is not therefore limited to the above preferred embodiment, but may be modified, changed, and substituted without departing from the technical scope and spirit of the invention.

Although, for instance, tungsten was employed as the metal for constructing the connecting wire 504 in the above-described preferred embodiment, it is of course possible to use other materials such as Mo and Al. In addition, these metals may be formed by way of methods other than the CVD method, e.g., a chemical plating (e.g., electroless plating) method.

The advantage of the above-described preferred embodiment will now be summarized.

That is to say, a packaging substrate having fine through holes located with a higher positioning precision is provided, with the metal for forming the connecting wire being filled in the fine through holes.

What is claimed is:

1. A wafer-scale semiconductor integrated circuit device, comprising:
    a wafer scale semiconductor having a main surface including a central portion and peripheral portion, wherein the main surface of the wafer-scale semiconductor substrate has substantially a circular shape;
    a plurality of memory blocks being formed on the main surface of the wafer-scale semiconductor substrate and each having substantially a same area size on the main surface, wherein the memory blocks are substantially provided at the central portion of the main surface; and
    a plurality of preliminary memory circuits formed at the peripheral portion of the main surface of the wafer-scale semiconductor substrate, wherein each of the preliminary memory circuits occupies a smaller area than that of a memory block, the preliminary memory circuits being used for relieving defects in the memory blocks by storing data in the preliminary memory circuits instead of in the memory blocks.

2. A wafer-scale semiconductor integrated circuit device according to claim 1, wherein each of the preliminary memory circuits occupies substantially a rectangular area on the main surface, and wherein each of the memory blocks occupies substantially a rectangular area on the main surface.

3. A wafer-scale semiconductor integrated circuit device according to claim 1, wherein a memory capacity of a preliminary memory circuit is smaller than that of a memory block.

4. A wafer-scale semiconductor integrated circuit device according to claim 1, further comprising structure for supplying a selection signal to a preliminary memory circuit, of the plurality of preliminary memory circuits, instead of to a memory block containing a defect.

5. A wafer-scale semiconductor integrated circuit device according to claim 1, wherein the preliminary memory circuits include memory structure for storing data.

6. A wafer-scale semiconductor integrated circuit device according to claim 5, wherein said memory structure includes a memory array corresponding to a memory array of the memory block.

7. A wafer-scale semiconductor integrated circuit device according to claim 1, wherein each of the memory blocks is comprised of a plurality of memory mats, and wherein a memory capacity of a preliminary memory circuit is substantially the same as that of a memory mat.

8. A wafer-scale semiconductor integrated circuit device according to claim 7, wherein a memory capacity of a memory block is substantially the same as that of a predetermined number of the preliminary memory circuits, and wherein a means for supplying a selection signal to a memory block containing defects changes the selection signal to the predetermined number of the preliminary memory circuits.

9. A wafer-scale semiconductor integrated circuit device according to claim 7, further comprising means for supplying a selection signal to a memory block, said means for supplying a selection signal also including means, when a memory mat contains a defect, to select a preliminary memory circuit instead of the memory mat containing the defect.

10. A wafer-scale semiconductor integrated circuit device according to claim 1, wherein a block address for designating the respective memory blocks is allocated to the respective memory blocks.

11. A wafer-scale semiconductor integrated circuit device according to claim 10, wherein a selection operation of a preliminary memory circuit is performed by employing the block address.

12. A wafer-scale semiconductor integrated circuit device according to claim 1, further comprising:
means for sending out externally a signal of the block address which corresponds to a memory block containing a defect.

13. A wafer-scale semiconductor integrated circuit device according to claim 1, wherein each of the memory blocks includes a memory array and a decoder circuit.

14. A wafer-scale semiconductor integrated circuit device, comprising:
a wafer-scale semiconductor substrate having a main surface including a central portion and peripheral portion, wherein the main surface has substantially a circular shape;
a plurality of memory blocks formed on the main surface of the wafer-scale semiconductor substrate, wherein each of the memory blocks occupies substantially a rectangular area on the main surface, and wherein the memory blocks have substantially a same area size on the main surface and are substantially provided at the central portion of the main surface; and
means for relieving defects in the memory blocks, said means including a plurality of memory circuits each of which is formed at the peripheral portion of the main surface of the wafer-scale semiconductor substrate, wherein each of the memory circuits occupies substantially a rectangular area on the main surface, and wherein each of the memory circuits occupies a smaller area than that of each of the memory blocks, the memory circuits being used for relieving defects in the memory blocks by storing data in the memory circuits instead of in the memory blocks.

15. A wafer-scale semiconductor integrated circuit device according to claim 14, wherein a memory capacity of a memory circuit is smaller than that of a memory block.

16. A wafer-scale semiconductor integrated circuit device according to claim 14, further comprising structure for supplying a selection signal to a memory circuit, of the plurality of memory circuits, instead of to a memory block containing a defect.

17. A wafer-scale semiconductor integrated circuit device according to claim 14, wherein the memory circuits include memory structure for storing data.

18. A wafer-scale semiconductor integrated circuit device according to claim 17, wherein said memory structure includes a memory array corresponding to a memory array of a memory block.

19. A wafer-scale semiconductor integrated circuit device according to claim 14, wherein a block address for designating the respective memory blocks is allocated to the respective memory blocks.

20. A wafer-scale semiconductor integrated circuit device, comprising:
a wafer-scale semiconductor substrate having a main surface including a central portion and peripheral portion, wherein the main surface has substantially a circular shape;
a plurality of memory blocks formed on the main surface of the wafer-scale semiconductor substrate, wherein each of the memory blocks occupies substantially a rectangular area on the main surface, and wherein the memory blocks have substantially a same area size on the main surface and are substantially provided at the central portion of the main surface; and
means for relieving defects in the memory blocks, said means including a plurality of memory circuits each of which is formed at the peripheral portion of the main surface of the wafer-scale semiconductor substrate, wherein each of the memory circuits occupies substantially a rectangular area on the main surface, wherein each of the memory circuits occupies a smaller area than that of each of the memory blocks and wherein the memory circuits include memory arrays and decoder circuits.

21. A wafer-scale semiconductor integrated circuit device according to claim 20, wherein the memory blocks include memory arrays and decoder circuits.

22. A wafer-scale semiconductor integrated circuit device, comprising:
a wafer-scale semiconductor substrate having a main surface including a central portion and peripheral portion, wherein the main surface of the wafer-scale semiconductor substrate has substantially a circular shape;
a plurality of memory blocks being formed on the main surface of the wafer-scale semiconductor substrate and each having substantially a same area size on the main surface, wherein the memory blocks are substantially provided at the central portion of the main surface; and
a plurality of preliminary memory circuits formed at the peripheral portion of the main surface of the wafer-scale semiconductor substrate, wherein each of the preliminary memory circuits occupies a smaller area than that of a memory block, and wherein each of the preliminary memory circuits includes a memory array and a decoder circuit.

23. A wafer-scale semiconductor integrated circuit device, comprising:
- a wafer-scale semiconductor substrate having a main surface including a central portion and peripheral portion, wherein the mean surface has substantially a circular shape;
- a plurality of memory blocks formed on the main surface of the wafer-scale semiconductor substrate, wherein each of the memory blocks occupies substantially a rectangular area on the main surface, wherein the memory blocks have substantially s same area size on the main surface and are substantially provided at the central portion of the main surface, and wherein the memory blocks are comprised of a plurality of memory mats; and
- means for relieving defects in the memory blocks, said means including a plurality of memory circuits each of which is formed at the peripheral portion of the main surface of the wafer-scale semiconductor substrate, wherein each of the memory circuits occupies substantially a rectangular area on the main surface, wherein each of the memory circuits occupies a smaller area than that of each of the memory blocks, and wherein a memory capacity of the memory circuit is substantially the same as that of the memory mat.

24. A wafer-scale semiconductor integrated circuit device, comprising:
- a wafer-scale semiconductor substrate having a main surface including a central portion and peripheral portion, wherein the main surface has substantially a circular shape;
- a plurality of memory blocks formed on the main surface of the wafer-scale semiconductor substrate, wherein each of the memory blocks occupies substantially a rectangular area on the main surface, and wherein the memory blocks have substantially a same area size on the main surface and are substantially provided at the central portion of the main surface; and
- means for relieving defects in the memory blocks, said means including a plurality of memory circuits each of which is formed at the peripheral portion of the main surface of the wafer-scale semiconductor substrate, wherein each of the memory circuits occupies substantially a rectangular area on the main surface, wherein each of the memory circuits occupies a smaller area than that of each of the memory blocks, and wherein a memory capacity of a memory block is substantially the same as that of a predetermined number of the memory circuits.

25. A wafer-scale semiconductor integrated circuit device, comprising:
- a wafer-scale semiconductor substrate having a main surface including a central portion and peripheral portion, wherein the main surface of the wafer-scale semiconductor substrate has substantially a circular shape;
- a plurality of memory blocks being formed on the main surface of the wafer-scale semiconductor substrate and each having substantially a same area size on the main surface, wherein the memory blocks are substantially provided at the central portion of the main surface, and wherein each of the memory blocks is comprised of a plurality of memory mats; and
- a plurality of preliminary memory circuits formed at the peripheral portion of the main surface of the wafer-scale semiconductor substrate, wherein each of the preliminary memory circuits occupies a smaller area than that of a memory block, wherein the preliminary memory circuits are used for relieving defects in the memory mats, and wherein a memory capacity of a preliminary memory circuit is substantially the same as that of a memory mat.

* * * * *